(12) United States Patent
Konda et al.

(10) Patent No.: US 7,566,893 B2
(45) Date of Patent: Jul. 28, 2009

(54) BEST FOCUS DETECTION METHOD, EXPOSURE METHOD, AND EXPOSURE APPARATUS

(75) Inventors: Naota Konda, Tokyo (JP); Tsuneyuki Hagiwara, Tokyo (JP)

(73) Assignee: Nikon Corporation, Tokyo (JP)

( * ) Notice: Subject to any disclaimer, the term of this patent is extended or adjusted under 35 U.S.C. 154(b) by 18 days.

(21) Appl. No.: 11/630,353

(22) PCT Filed: Jun. 21, 2005

(86) PCT No.: PCT/JP2005/011330

§ 371 (c)(1),
(2), (4) Date: Dec. 21, 2006

(87) PCT Pub. No.: WO2005/124834

PCT Pub. Date: Dec. 29, 2005

(65) Prior Publication Data

US 2008/0030715 A1    Feb. 7, 2008

(30) Foreign Application Priority Data

Jun. 22, 2004    (JP) .............................. 2004-183356

(51) Int. Cl.
*G01B 11/26* (2006.01)
(52) U.S. Cl. ............................. 250/548; 355/55; 355/67
(58) Field of Classification Search .................... 355/53, 355/55, 67; 359/399, 400; 250/548

See application file for complete search history.

(56) References Cited

U.S. PATENT DOCUMENTS

| 5,424,552 A | 6/1995 | Tsuji et al. |
| 5,650,840 A * | 7/1997 | Taniguchi ..................... 355/55 |
| 2002/0041377 A1 | 4/2002 | Hagiwara et al. |
| 2003/0090661 A1 | 5/2003 | Kobayashi |

FOREIGN PATENT DOCUMENTS

| JP | A-4-211110 | 8/1992 |
| JP | A 05-160003 | 6/1993 |
| JP | A 08-083753 | 3/1996 |
| JP | A 09-082620 | 3/1997 |
| JP | A 2002-014005 | 1/2002 |
| JP | A 2002-093690 | 3/2002 |
| JP | A-2002-195912 | 7/2002 |
| JP | A 2002-198303 | 7/2002 |
| JP | A 2003-151884 | 5/2003 |
| JP | A 2003-218024 | 7/2003 |
| JP | A 2005-116571 | 4/2005 |

* cited by examiner

*Primary Examiner*—Georgia Y Epps
*Assistant Examiner*—Tony Ko
(74) *Attorney, Agent, or Firm*—Oliff & Berridge, PLC

(57) ABSTRACT

An aerial image of a measurement mark arranged on a measurement mask is conformed to a center in an X-axis direction of a slit arranged on a Z tilt stage. While illuminating the measurement mark with an illumination light, a slit plate on which the slit is formed is continuously moved in a Z-axis direction, and based on position information of the slit obtained during the movement and a photoelectric conversion signal outputted from an optical sensor that receives the illumination light from the measurement mark via a projection optical system and the slit, a best focus position is detected. Thus, the best focus position of the projection optical system can be measured in a short period of time.

27 Claims, 11 Drawing Sheets

BEST FOCUS DETECTION METHOD, EXPOSURE METHOD, AND EXPOSURE APPARATUS

TECHNICAL FIELD

The present invention relates to best focus detection methods, exposure methods and exposure apparatuses, and more particularly to a best focus detection method in which a best focus position of a projection optical system is detected, an exposure method in which the best focus detection method is used, and an exposure apparatus that is suitable for carrying out the best focus detection method.

BACKGROUND ART

Conventionally, when manufacturing semiconductor devices, liquid-crystal display devices and the like in a photolithography process, a projection exposure apparatus that transfers a pattern of a photomask or a reticle (hereinafter generally referred to as 'reticle') onto an object such as a wafer whose surface is coated with photosensitive agent such as a photoresist or onto a glass plate (hereinafter generally referred to as 'wafer) via a projection optical system, for example, a projection exposure apparatus of a sequentially moving type such as a reduction projection exposure apparatus by a step-and-repeat method (the so-called stepper), and a scanning projection exposure apparatus by a step-and-scan method (the so-called scanning stepper (also called as a scanner)) has been used.

When performing exposure using this type of projection exposure apparatus, in order to prevent as much as possible exposure defects caused by defocus from occurring, it is necessary to detect the position of a wafer in an optical axis direction of a projection optical system by a focal position detection system (focus detection system) and to conform an area to be exposed (area to which an exposure light is irradiated) on the wafer to a best image-forming plane of the projection optical system (to locate the area to be exposed within a range of depth of focus). For this purpose, it is important to detect a best image-forming plane or a best focus position of a projection optical system with good accuracy and to perform calibration of the foregoing focal position detection system (focus detection system) based on the detection result, that is, adjustment of a detection origin or adjustment of a detection offset.

As a detection method of a best focus position of a projection optical system, a method (exposing method) in which a measurement mark formed on a measurement reticle is transferred via a projection optical system to different positions on a wafer at different positions in an optical axis direction of the projection optical system, a best focus position of the projection optical system is detected based on a formation state of a transferred image of the mark formed on the wafer; and a method (aerial image measurement method) in which actual exposure is not performed, an aerial image measurement unit is arranged on a wafer stage that is placed on an image plane side of a projection optical system, the aerial image measurement unit detects light intensity of a projected image (aerial image) of the foregoing measurement mark, and a best focus position of the projection optical system is detected based on the detection result are known. In this case, the aerial image measurement unit is an all-inclusive term of a unit that is arranged on a wafer stage on which a wafer is mounted, and has a pattern plate on which an aperture pattern having a predetermined shape is formed and a photodetection system that receives a light via the pattern plate.

Conventional detection of a best focus position in an aerial image measurement method has been performed basically in procedures as in the following a. to d. (refer to Patent Documents 1, 2, 3 and the like).

a. In a state where a measurement mark (e.g. to be a mark made up of a line-and-space pattern) is formed, a reticle or the like placed on an object plane of a projection optical system is illuminated by an illumination light and an image of the measurement mark is projected to an image plane by the projection optical system, a wafer stage is moved in a predetermined direction within a two-dimensional plane that is orthogonal to an optical axis of the projection optical system so that a pattern plate is scanned with respect to the projected image, and an aerial image of the measurement mark is measured by a photodetection system receiving a light via the pattern plate during the movement.

b. the aerial image measurement as in the above a. is repeated at a plurality of positions in an optical axis direction of the projection optical system (hereinafter referred to as 'Z position' for the sake of convenience).

c. Then, Fourier transform is respectively performed to a light intensity signal waveform of an aerial image at each Z position, and predetermined information such as contrast (an amplitude ratio between a first-order frequency component and a direct current component) that is obtained from the light intensity signal waveform of the aerial image at each Z position is respectively obtained.

d. Then, coordinate positions (Z positions, contrast values) at a plurality of points (e.g. 15 points) that are obtained as a result of the above c. are plotted on an orthogonal coordinate system having Z positions as a horizontal axis and contrast values as a vertical axis, and a best focus position is obtained based on an approximate curve that is obtained by performing the least squares approximation to the plurality of points However, as can be seen from the forgoing description, in the best focus detection method by the conventional aerial image measurement, an operation of changing the position of the pattern plate (wafer stage) in multiple stages in the optical axis direction of the projection optical system and scanning the wafer stage (pattern plate) with respect to an aerial image at each position is essential, which has required a long period of time for measurement by necessity. As a method to improve such inconvenience, it can be considered that the number of steps described above is reduced, however, detection accuracy of a best focus position is lowered by doing so.

Patent Document 1: the U.S. Patent Application Publication No. 2002/041377

Patent Document 2: Kokai (Japanese Unexamined Patent Application Publication) No. 2002-014005

Patent Document 3: Kokai (Japanese Unexamined Patent Application Publication) No. 2002-198303

DISCLOSURE OF INVENTION

Means for Solving the Problems

The present invention has been made under the circumstances described above, and according to a first aspect of the present invention, there is provided a best focus detection method in which a best focus position of a projection optical system that forms an image of a pattern placed on a first surface on a second surface, the method comprising: a first process in which while illuminating a mark placed on the first surface with an illumination light, a pattern plate on which an aperture pattern is formed is scanned in a predetermined measurement direction with respect to an image of the mark formed by the projection optical system within a two-dimensional plane orthogonal to an optical axis of the projection optical system in the vicinity of the second surface, the illumination light via the aperture pattern is received during the scanning, and position information of the image of the mark related to the measurement direction is detected; a second process in which a position of the pattern plate is set within the two-dimensional plane based on the position information, the pattern plate is moved in the optical axis direction while illuminating the mark placed on the first surface with the illumination light, and position data of the pattern plate related to the optical axis direction and intensity data of the illumination light are obtained during the movement; and a third process in which a best focus position of the projection optical system is computed based on the obtained position data and the obtained intensity data.

With this method, while illuminating a mark placed on the first surface with an illumination light, by scanning a pattern plate in a predetermined measurement direction with respect to an image (aerial image) of the mark that is formed by the projection optical system, within a two-dimensional plane orthogonal to an optical axis of the projection optical system in the vicinity of the second surface, and receiving the illumination light via an aperture pattern formed on the pattern plate during the scanning, position information of the image of the mark related to the measurement direction is detected. Next, in a state where the position of the pattern plate is set within the two-dimensional plane based on the detected position information, while illuminating the mark with the illumination light, the pattern plate is moved in the optical axis direction of the projection optical system and position data of the pattern plate related to the optical axis direction and intensity data of the illumination light are obtained during the movement. In this case, each data described above can be obtained while continuously moving the pattern plate in the optical axis direction.

Then, based on the position data and the intensity data obtained as described above, a best focus position of the projection optical system is computed.

As is described above, in the best focus detection method of the present invention, the data used to compute a best focus position of the projection optical system can be obtained by a combination of one scanning of the pattern plate within a two-dimensional plane orthogonal to an optical axis of the projection optical system and one scanning of the pattern plate in the optical axis direction of the projection optical system after the former scanning. Accordingly, since it is not necessary to change the position of a pattern plate to multiple points in the optical axis direction and also to scan the pattern plate at each point as in the conventional example described earlier, the measurement time can be shortened remarkably. Further, by setting the sampling intervals as detailed as possible, a number of data can be obtained, and therefore, improvement in detection accuracy (detection resolution) of a best focus position is also expected.

In this case, in the third process, smoothing of at least one of a plurality of the position data and a plurality of the intensity data is performed at least once using moving average, and a change curve of intensity of the illumination light with respect to the position of the pattern plate in the optical axis direction is computed using both data after smoothing, or one of the data after smoothing and the other of the data that has not been smoothed, and based on the change curve, a best focus position can be computed. In such a case, as a consequence of reducing the effect of noise components by the foregoing smoothing, detection accuracy of a best focus position can be improved.

According to a second aspect of the present invention, there is provided an exposure method in which a predetermined pattern is formed on an object via a projection optical system, the method comprising: a detection process in which a best focus position of the projection optical system is detected using the best focus detection method of the present invention; and an exposure process in which a position of the object in an optical axis direction of the projection optical system is adjusted using a detection result of the best focus position, and the pattern is formed on the object via the projection optical system.

With this method, a best focus position of the projection optical system is detected using the best focus detection method of the present invention (the detection process), and the position of the object in an optical axis direction of the projection optical system is adjusted using a detection result of the detection process and a pattern is formed via the projection optical system on the object whose position in the optical axis direction is adjusted (the exposure process). Accordingly, because processing in the detection process is performed in a short period of time, throughput in all processes including the detection process and the exposure process can be improved. Further, since detection accuracy of a best focus position of the projection optical system can also be improved as is described above, a pattern can be formed on an object with high accuracy and with very few exposure defects as a consequence.

According to a third aspect of the present invention, there is provided an exposure apparatus that forms a pattern placed on a first surface on an object placed on a second surface using a projection optical system, the apparatus comprising: a moving member on which an aperture pattern is arranged; a drive system that drives the moving member in an optical axis direction of the projection optical system and directions within a two-dimensional plane that is orthogonal to the optical axis direction; a sensor section that includes a photodetection element that receives an illumination light via the aperture pattern arranged on the moving member; an illumination system that illuminates a mark placed on the first surface; a first processing unit that scans and drives the moving member in a predetermined measurement direction via the drive system with respect to an image of the mark formed by the projection optical system within the two-dimensional plane in the vicinity of the second surface so that the aperture pattern is scanned in the measurement direction, while illuminating the mark with the illumination light from the illumination system, and detects position information of the image of the mark related to the measurement direction based on an output signal from the photodetection element of the sensor section during the scanning and driving; a second processing unit that sets a position of the moving member within the two-dimensional plane based on the position information, moves the moving member in the optical axis direction via the drive system while illuminating the mark placed on the first surface with the illumination light from the illumination system, and obtains position data of the moving member related to the optical axis direction and intensity data of the illumination light during the movement; and a computation unit that computes a best focus position of the projection optical system based on the position data obtained by the second processing unit and the intensity data obtained by the second processing unit.

With this apparatus, while illuminating a mark placed on the first surface with an illumination light from the illumination system, the first processing unit scans and drives the moving member in a predetermined measurement direction with respect to an image of the mark formed by the projection optical system within the two-dimensional plane via the drive system so that a predetermined aperture pattern arranged on the moving member can be scanned in the measurement direction in the vicinity of the second surface, and detects position information of the image of the mark related to the measurement direction based on an output signal from the photodetection element of the sensor section during the scanning and driving. Then the second processing unit moves the moving member in the optical axis direction via the drive system while illuminating the mark placed on the first surface with an illumination light from the illumination system, in a state where the position of the moving member is set within the two-dimensional plane based on the position information detected by the first processing unit, and obtains position data of the moving member related to the optical axis direction and intensity data of the illumination light during the movement. In this case, the second processing unit can obtain each of the foregoing data by continuously moving the pattern plate in the optical axis direction.

Then, the computation unit computes a best focus position of the projection optical system based on the position data that the second processing unit has obtained as described above and the intensity data that the second processing unit has obtained.

As is described above, in the exposure apparatus of the present invention, the data used to compute a best focus position of the projection optical system can be obtained by a combination of one scanning of the moving member (pattern plate) within a two-dimensional plane orthogonal to an optical axis of the projection optical system that is performed by the first processing unit and one scanning of the moving member (pattern plate) in the optical axis direction of the projection optical system that is performed by the second processing unit after the former scanning. Accordingly, since it is not necessary to change the position of a pattern plate to multiple points in the optical axis direction and also to scan the pattern plate at each point as in the conventional example described earlier, the measurement time can be shortened remarkably. Further, by setting the sampling intervals as detailed as possible, the second processing unit can obtain a number of data, and therefore, improvement in computation accuracy (detection resolution) of a best focus position that is to be computed by the computation unit based on the obtained data is also expected.

Further, by adjusting the position of the object in the optical axis direction of the projection optical system based on the best focus position of the projection optical system that has been computed by the computation unit and forming a pattern on the object via the projection optical system, the formation with high accuracy of the pattern on the object with very few exposure defects due to defocus becomes possible.

BEST MODE FOR CARRYING OUT THE INVENTION

An embodiment of the present invention will be described below, referring to FIGS. 1 to 11.

Figure 1:
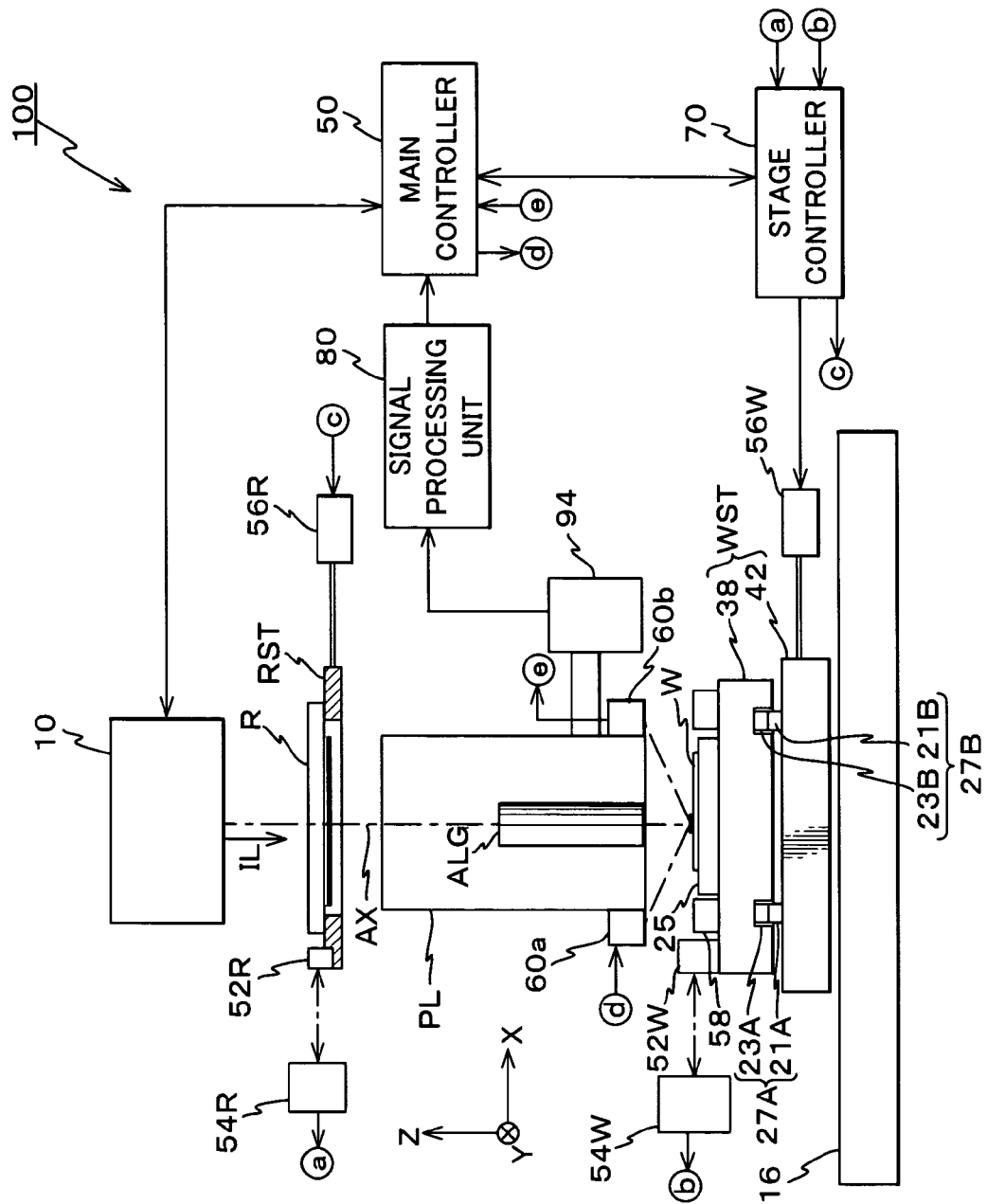
FIG. 1 is a view showing a schematic configuration of an exposure apparatus related to an embodiment.

FIG. 1 shows a schematic configuration of an exposure apparatus 100 related to the embodiment. Exposure apparatus 100 is a scanning projection exposure apparatus by a step-and-scan method, that is, the so-called scanning stepper (which is also called as a scanner).

Exposure apparatus 100 is equipped with an illumination system 10 that contains a light source and an illumination optical system (none of which are shown), a reticle stage RST on which a reticle R is mounted, a projection optical system PL, a wafer stage WST on which a wafer W is mounted, a control system that controls them, and the like. Further, of the foregoing components, the sections except for the light source and a part of the control system are actually housed in an environmental control chamber (environmental chamber) (not shown) in which environmental conditions such as the temperature, pressure and the like are maintained at a substantially constant level.

Illumination system 10 includes the light source, an illuminance uniformity optical system including an optical integrator (homogenizer) and the like, a beam splitter, a relay lens, a variable ND filter, a reticle blind and the like (none of which are shown), as is disclosed in, for example, Kokai (Japanese Unexamined Patent Application Publication) No. 2001-313250, and the corresponding U.S. Patent Application Publication No. 2003/0025890, and the like. Illumination system 10 illuminates an illumination light (exposure light) IL to a slit-shaped illumination area on reticle R that is set by the reticle blind with substantially uniform illuminance. In this case, as the light source, as an example, an ArF excimer laser that emits (oscillates) a pulse laser beam in a vacuum ultraviolet region having a wavelength of 193 nm is used. Further, as the optical integrator, a fly-eye lens, a rod integrator (internal reflection type integrator) or a diffraction optical element can be used. Incidentally, the illumination system may be configured similarly to an illumination system as is disclosed in, for example, Kokai (Japanese Unexamined Patent Application Publication) No. 06-349701, and the corresponding U.S. Pat. No. 5,534,970, and the like. As long as the national laws in designated states (or elected states), to which this international application is applied, permit, the above disclosures of the publications, the U.S. Patent Application Publication and the U.S. Patent are incorporated herein by reference.

On reticle stage RST, reticle R is mounted, and reticle R having a pattern surface (a lower surface in FIG. 1) on which a circuit pattern or the like is formed, and reticle R is fixed by, for example, vacuum suction (or electrostatic suction). Reticle stage RST is finely drivable two-dimensionally within an XY plane (an X-axis direction and a Y-axis direction orthogonal to the X-axis direction, and a rotation direction ($\theta z$ direction) around a Z-axis direction orthogonal to the XY plane, and also drivable on a reticle base (not shown) in a predetermined scanning direction (in this case, to be the Y-axis direction that is an orthogonal direction to the page surface of FIG. 1) with a designated scanning velocity.

On reticle stage RST, a movable mirror 52R is fixed, and the position of reticle stage RST within the XY plane is constantly detected at a resolution of, for example, approximately 0.5 to 1 nm with a reticle laser interferometer (hereinafter referred to as 'reticle interferometer') 54R via movable mirror 52R. In this case, in actual, a Y movable mirror having a reflection surface orthogonal to a scanning direction (the Y-axis direction) on scanning exposure and an X movable mirror having a reflection surface orthogonal to a non-scanning direction (the X-axis direction) are arranged on reticle stage RST, and a reticle Y interferometer and a reticle X interferometer corresponding to these movable mirrors are arranged. However, they are represented by movable mirror 52R and reticle interferometer 54R in FIG. 1. Incidentally, for example, an end surface of reticle stage RST may be polished in order to form a reflection surface (corresponding to a reflection surface of the X movable mirror and the Y-movable mirror described above). Further, at least one corner cubic mirror (e.g. a retroreflector) may be used, instead of a reflection surface extending in the X-axis direction that is used to detect the position of reticle stage RST in the scanning direction (the Y-axis direction in the embodiment). In this case, one of the reticle Y interferometer and the reticle X interferometer, for example, the reticle Y interferometer is a double-axis interferometer that has two measurement axes, and besides the Y-position of reticle stage RST, a rotation in the Z-axis direction ($\theta z$ direction) can be measured based on the measurement value of the reticle Y interferometer.

Position information (or velocity information) of reticle stage RST from reticle interferometer 54R is sent to a stage controller 70 and to a main controller 50 via stage controller 70. Stage controller 70 controls the movement of reticle stage RST via a reticle stage drive system 56R based on instructions of main controller 50.

Projection optical system PL has a direction of an optical axis AX in the Z-axis direction, and is placed below reticle stage RST in FIG. 1. As projection optical system PL, in this case, a dioptric system that is a both-side telecentric reduction system, and includes a plurality of lens elements placed at predetermined spacing along optical axis AX is used. The projection magnification of projection optical system PL is, for example, ¼, ⅕ or the like. Therefore, when an illumination light IL from illumination system 10 illuminates a slit-shaped or circular-arc-shaped illumination area (set by the reticle blind described earlier) extending in the X-axis direction on reticle R, illumination light IL that has passed through reticle R forms a reduced image (a partial inverted image) of the circuit pattern within the illumination area on a projection area (hereinafter, also referred to as 'exposure area') of illumination light IL, which is conjugate with the illumination area, on wafer W whose surface is coated with a photoresist (photosensitive agent), via projection optical system PL.

Wafer stage WST includes an XY stage 42 and a Z tilt stage 38 that constitutes at least a part of a movable member mounted on XY stage 42.

XY stage 42 is supported above the upper surface of a wafer stage base 16 by an air bearing (not shown), for example, via a clearance of around several µm, and is structured two-dimensionally drivable in the Y-axis direction serving as the scanning direction (the direction orthogonal to the page surface in FIG. 1) and the X-axis direction orthogonal to the Y-axis direction (a horizontal direction of the page surface in FIG. 1) by a linear motor or the like (not shown) that constitutes a wafer stage drive system 56W.

Z tilt stage 38 is supported at three points on XY stage 42 by three Z position drive systems 27A, 27B and 27C (however, Z position drive system 27C in the depth of the page surface is not shown). Z position drive systems 27A to 27C include three actuators (such as voice coil motors) 21A, 21B and 21C (however, actuator 21C in the depth of the page surface is not shown) that independently drive each support point arranged at the lower surface of Z tilt stage 38 in the optical axis direction (Z-axis direction) of projection optical system PL, and encoders 23A to 23C (however, encoder 23C in the depth of the page surface is not shown) that respectively detect a drive amount (displacement from a datum position) in the Z-axis direction of each support point driven by each of actuators 21A, 21B and 21C. In this case, as encoders 23A to 23C, for example, a linear encoder by an optical method, a capacitance method or the like can be used. In the embodiment, actuators 21A to 21C constitute at least a part of a drive unit that drives Z tilt stage 38 in the optical axis AX direction (Z-axis direction) and oblique directions with respect to a plane (XY plane) orthogonal to the optical axis, that is, a $\theta x$ direction being a rotation direction around the X-axis and a $\theta y$ direction being a rotation direction around the Y-axis. Further, the drive amount (displacement amount from the datum point) in the Z-axis direction of each support point driven by Z position drive systems 27A to 27C of Z tilt stage 38 that is measured by encoders 23A to 23C is supplied to stage controller 70 and main controller 50 via stage controller 70.

On Z tilt stage 38, a movable mirror 52W is fixed, and the position of Z tilt stage 38 (wafer stage WST) within the XY plane is constantly detected at a resolution of, for example, around 0.5 to 1 nm with a wafer laser interferometer (hereinafter referred to as 'wafer interferometer') 54W, which is placed outside, via movable mirror 52W.

Here, in actual, on Z tilt stage 38, a Y movable mirror having a reflection surface orthogonal to the Y-axis direction serving as a scanning direction on scanning exposure and an X movable mirror having a reflection surface orthogonal to the X-axis direction serving as a non-scanning direction are arranged, and as the wafer interferometer, an X laser interferometer for X-axis direction position measurement and a Y laser interferometer for Y-axis direction position measurement are arranged corresponding to these movable mirrors. However, in FIG. 1, they are represented by movable mirror 52W and wafer interferometer 54W. Incidentally, for example, an end surface of Z tilt stage 38 may be polished in order to form a reflection surface (corresponding to a reflection surface of the X movable mirror and Y movable mirror described above). Further, the X laser interferometer and the Y laser interferometer are multi-axis interferometers that have a plurality of measurement axes, and with these interferometers, besides the X and Y positions of wafer stage WST, rotation (yawing ($\theta z$ rotation being the rotation around the Z axis)), pitching ($\theta x$ rotation being the rotation around the X axis) and rolling ($\theta y$ rotation being the rotation around the Y axis) can also be measured. Accordingly, in the following description, the position of Z tilt stage 38 in directions of five degrees of freedom, i.e. the X, Y, $\theta z$, $\theta y$ and $\theta x$ directions is to be measured by wafer interferometer 54W. Further, the multi-axis interferometer irradiates a laser beam to a reflection surface arranged on a frame (not shown) on which projection optical system PL is mounted via a reflection surface arranged on Z tilt stage 38 at an inclination of 45 degrees, and may detect relative position information of projection optical system PL related to the optical axis direction (Z-axis direction).

Position information (or velocity information) of wafer stage WST is supplied to stage controller 70 and to main controller 50 via stage controller 70. According to instructions of main controller 50, stage controller 70 controls the position of wafer stage WST within the XY plane via wafer stage drive system 56W.

On Z tilt stage 38, a wafer holder 25 is arranged, on which wafer W is mounted and fixed by vacuum suction (or electrostatic suction) by wafer holder 25.

Figure 2:
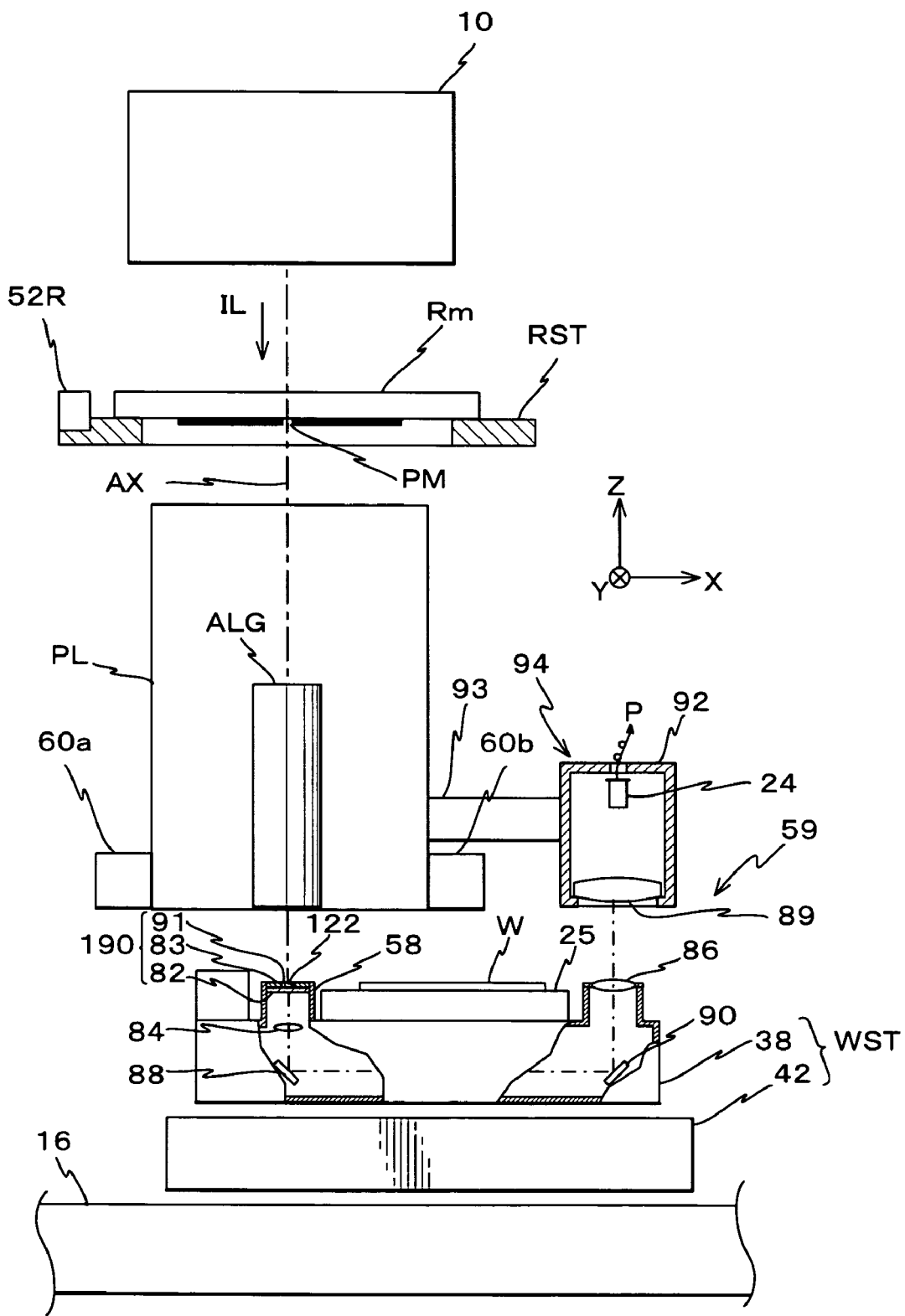
FIG. 2 is a view used to explain an aerial image measurement unit in FIG. 1.

Inside Z tilt stage 38, as is shown in FIG. 2, a part of an optical system that constitutes an aerial image measurement unit 59 used for measurement of optical properties of projection optical system PL is placed. Next, the configuration of aerial image measurement unit 59 will be described in detail.

Aerial image measurement unit 59 is equipped with an inside-stage section arranged in Z tilt stage 38, that is, a slit plate 190, a lens 84, mirrors 88 and 90 for deflecting the optical path and a light transmitting lens 86, and an outside-stage section arranged outside wafer stage WST, that is, a photodetection lens 89, an optical sensor 24 made up of a photoelectric conversion element, and the like.

To be more specific, as is shown in FIG. 2, slit plate 190 is fixed to a protruding section 58 that has a cylindrical shape and arranged on the upper surface of Z tilt stage 38, in a state of closing an opening in an upper portion of protruding section 58. The upper surface of slit plate 190 is to be in a state of substantially coplanar (flush) with a surface of wafer W that is suctioned by wafer holder 25 described above. Slit plate 190 has a photodetection glass 82, reflective film 83 and a light shielding film 91. Photodetection glass 82 has a circular-shape and made of materials such as synthetic quartz or fluorite that has high transmittance to illumination light IL having a wavelength of 193 nm, reflective film 83 that also serves as a light shielding film is composed of a thin film made of metals such as aluminum and formed on a portion excluding a circular area in the center portion on the upper surface of photodetection glass 82, and light shielding film 91 is composed of a thin film made of chromium and formed in the circular area.

As an example, reflective film 83 is substantially rectangular shaped having the length of 50 mm in the Y-axis direction and the length of 30 mm in the X-axis direction, and a diameter of light shielding film 91 in the center is, for example, about 4.5 mm. On light shielding film 91, a slit-shaped aperture pattern (hereinafter appropriately referred to as 'slit') 122 having a predetermined width extending in the Y-axis direction is formed by patterning. The predetermined width is to be, for example, 0.2 μm.

Inside Z tilt stage 38 below slit plate 190, as is shown in FIG. 2, lens 84 and deflecting mirror 88 are sequentially placed below aperture pattern 122. Deflecting mirror 88 is arranged at an inclination of 45 degrees. Therefore, illumination light IL (image beam) that is incident vertically downward (−Z direction) via aperture pattern 122 and photodetection glass 82 passes through lens 84 and the optical path of the illumination light is deflected by deflecting mirror 88 by 90 degrees toward a +X direction. In the rear of the optical path of illumination light IL that is deflected by deflecting mirror 88, mirror 90 that further deflects the optical path by 90 degrees vertically upward (+Z direction) is placed, and light transmitting lens 86 that sends illumination light IL outside Z tilt stage 38 is fixed to the upper wall portion of Z tilt stage 38, which is located in the rear of the optical path of illumination light IL deflected by mirror 90.

In the optical path of illumination light IL that is sent to the outside of Z tilt stage 38 by light transmitting lens 86, photodetection lens 89 that has a larger diameter compared to light transmitting lens 86 is placed. At the position above photodetection lens 89, an optical sensor 24 is placed. Photodetection lens 89 and optical sensor 24 are housed in a case 92 while maintaining a predetermined positional relation, and case 92 is fixed to the side surface of a barrel of projection optical system PL via an attachment member 93. A photodetector 94 is configured including photodetection lens 89, optical sensor 24 and case 92.

As optical sensor 24, a photoelectric conversion element (photodetection element) that can detect faint light with good accuracy, for example, a photo multiplier tube (PMT, photoelectron doubling tube) or the like is used. An output signal of optical sensor 24 is sent to a signal processing unit 80 shown in FIG. 1. Signal processing unit 80 includes, for example, an amplifier, an A/D converter (normally, the converter with 16-bit resolution is used) and the like. The output from signal processing unit 80 is sent to main controller 50.

With aerial image measurement unit 59 configured as described above, for example, when measuring an image (aerial image) projected by projection optical system PL of a measurement mark formed on a measurement reticle to be described later or the like, slit plate 190 is illuminated with illumination light IL that has passed through projection optical system PL, and illumination light IL passing through aperture pattern 122 on slit plate 190 is guided to the outside of Z tilt stage 38 via lens 84, mirrors 88 and 90 and light transmitting lens 86. Then, the light guided outside Z tilt stage 38 is received by photodetector 94 (to be more accurate, by optical sensor 24), and a photoelectric conversion signal (light amount signal) P in accordance with the photodetection amount is supplied from optical sensor 24 of photodetector 94 to signal processing unit 80.

In the embodiment, on the measurement of an aerial image described above, slit plate 190 needs to cross the aerial image, and when slit plate 190 crosses the aerial image, light transmitting lens 86 moves with respect to photodetector 94. Accordingly, in aerial image measurement unit 59, a size of each lens and mirror is set so that all the illumination lights from light transmitting lens 86 that moves in a predetermined range enter photodetector 94.

Since aerial image measurement unit 59 is configured as described above, measurement accuracy of wafer interferometer 54W or the like is not adversely affected due to heat generation of optical sensor 24. Further, because the outside and the inside of Z tilt stage 38 are not connected by light guide or the like, drive accuracy of Z tilt stage 38 is not adversely affected as in the case where the outside and the inside of Z tilt stage 38 are connected by light guide.

As a matter of course, in the case the influence of heat can be eliminated, optical sensor 24 may be arranged inside Z tilt stage 38.

On the side surface of projection optical system PL, an off-axis alignment system ALG that detects an alignment mark (positioning mark) on wafer W or a fiducial mark serving as a datum of position control is arranged. In the embodiment, as alignment system ALG, an alignment sensor based on the so-called FIA (Field Image Alignment) system image processing method is used that includes a light source for alignment (such as a halogen lamp emitting a broadband illumination light), an optical system, an index plate on which an index mark is formed, an imaging device (CCD), and the like. An imaging signal from alignment system ALG is sent to an alignment controller (not shown), and the alignment controller outputs position information of the alignment mark (or the fiducial mark) with respect to a detection center of the alignment system (corresponding to the center of the index mark described above) to main controller 50. Main controller 50 computes a position coordinate of the alignment mark on a stage coordinate system that is set by the measurement axes of wafer interferometer 54W based on the position information and position information of wafer stage WST that is the output of wafer interferometer 54W at this point of time.

Further, in exposure apparatus 100 of the embodiment, as is shown in FIG. 1, a multipoint focal position detection system (60a, 60b) by an oblique incident method, which constitutes at least a part of a measurement unit that includes an irradiation system 60a and a photodetection system 60b and detects the position of wafer W in the optical axis AX direction, is arranged. Irradiation system 60a has a light source which on/off is controlled by main controller 50, and irradiates beams for forming multiple images of pinholes or slits toward an image-forming plane of projection optical system PL to a surface of wafer W from an oblique direction with respect to optical axis AX. Photodetection system 60b receives the reflected beams generated by the beams reflecting off the surface of wafer W, and sends a focal point deviation signal (defocus signal) used to detect a focal point deviation, for example, an S curve signal to main controller 50. The detailed configuration of a multipoint focal position detection system similar to the multipoint focal position detection system (60a, 60b) is disclosed in, for example, Kokai (Japanese Unexamined Patent Application Publication) No. 06-283403, and the corresponding U.S. Pat. No. 5,448,332, and the like. As long as the national laws in designated states (or elected states), to which this international application is applied, permit, the above disclosures of the publication and the corresponding U.S. Patent are incorporated herein by reference.

Furthermore, in exposure apparatus 100 of the embodiment, above reticle R, a pair of reticle alignment detection systems is arranged a predetermined distance apart in the X-axis direction, though they are omitted in FIG. 1. The pair of reticle alignment detection systems is composed of a TTR (Through the Reticle) alignment system that uses light with an exposure wavelength for simultaneously observing a reticle mark on reticle R and a fiducial mark on a fiducial mark plate corresponding to the reticle mark via projection optical system PL. As the reticle alignment detection systems, the configuration similar to the one disclosed in, for example, Kokai (Japanese Unexamined Patent Application Publication) No. 07-176468, and the corresponding U.S. Pat. No. 5,646,413, and the like is used. As long as the national laws in designated states (or elected states), to which this international application is applied, permit, the above disclosures of the publication and the corresponding U.S. Patent are incorporated herein by reference.

The control system is mainly configured of main controller 50 that includes a workstation (or a microcomputer), and includes stage controller 70 under the control of main controller 50, signal processing unit 80, and the like.

Figure 3:
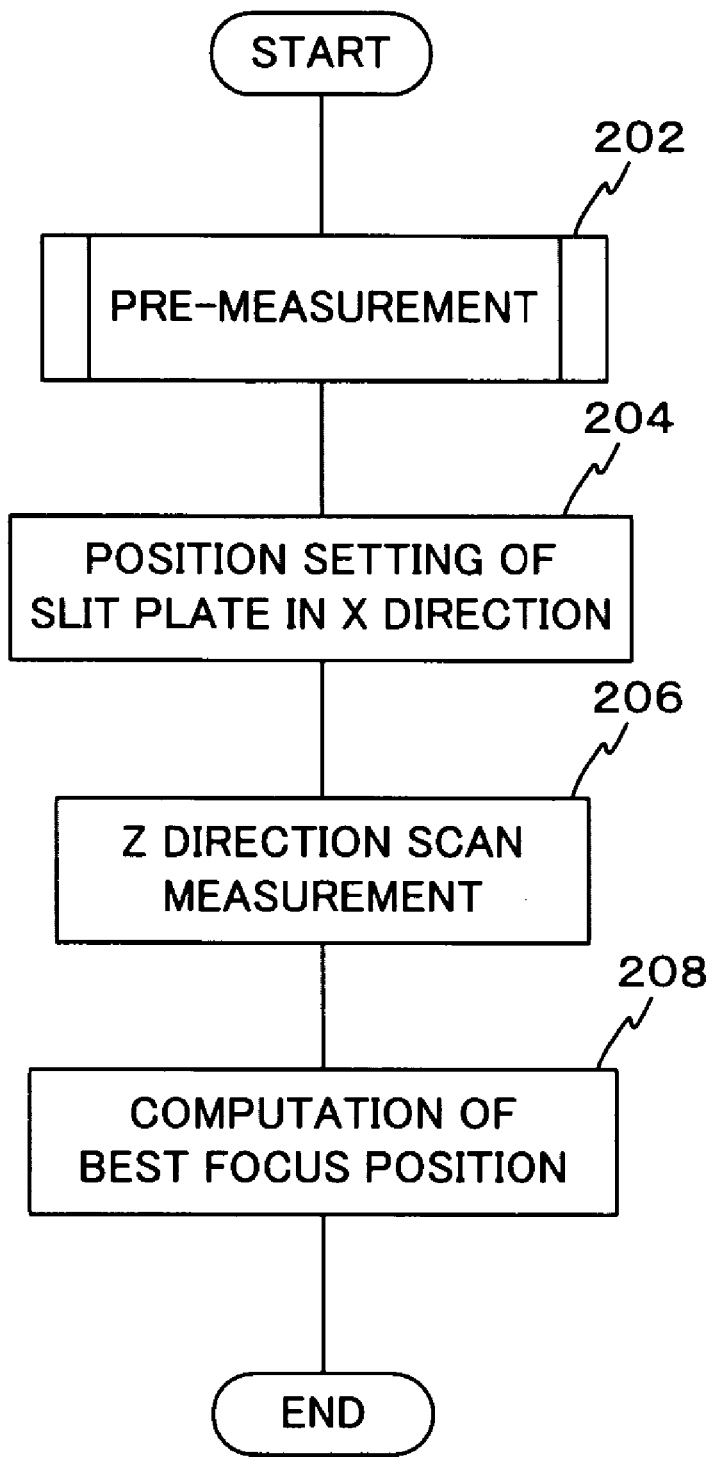
FIG. 3 is a flowchart used to explain a detection method of a best focus position of an embodiment.

Next, detection procedures of a best focus position, which are performed in exposure apparatus 100 of the embodiment configured as is described above, will be described along a flowchart in FIG. 3 (and FIG. 4) that shows a processing algorithm related to best focus position detection and also referring to other drawings as needed. The procedures of the flowchart in FIG. 3 are to start when an operator inputs a detection instruction of a best focus position.

First, in step 202, processing of a subroutine of pre-measurement is executed. In the subroutine of step 202, in step 302 in FIG. 4, a measurement reticle Rm shown in FIG. 2 is loaded on reticle stage RST via a reticle loader (not shown). On a pattern surface of measurement reticle Rm, a predetermined pattern area is formed, and a measurement mark PM that is made up of, for example, an aperture pattern formed on a part of a chromium layer is arranged within the pattern area. Measurement mark PM is to be a mark that has a longitudinal direction in the Y-axis direction and made up of an isolated line having a predetermined line width (e.g. about 0.2 μm).

In the next step, step 304, position adjustment of reticle stage RST is performed so that the position of measurement mark PM on measurement reticle Rm is set at a predetermined measurement point (which is to be a field center of projection optical system PL, that is, a measurement point on the optical axis, in this case) where a best focus position is to be measured within the field of projection optical system PL. The position adjustment of reticle stage RST can be performed, for example, based on detection results obtained by simultaneously detecting a pair of reticle alignment marks, which are formed respectively at positions symmetrically arranged with respect to a linear reticle center in the non-scanning direction that passes through the center (reticle center) of the pattern area on measurement reticle Rm, using the pair of reticle alignment detection systems described earlier.

In the next step, step 306, the reticle blind within illumination system 10 is driven and controlled and the illumination area is set (restricted) so that illumination light IL is irradiated only to a portion of measurement mark PM (a portion of the chromium layer where the measurement mark PM is formed).

In the next step, step 308, in order for a height position of a surface of slit plate 190, that is, the position in the Z-axis direction (hereinafter shortened to 'Z position') to be a predetermined initial position, the Z position of Z tilt stage 38 is adjusted via stage controller 70. As the 'initial position' in this case, for example, the Z position (height position) of default setting is employed on the start-up of the exposure apparatus or in the case the best focus position previously detected is deleted due to the initialization of the apparatus or the like. Further, in the case data of detection results of the best focus position previously obtained is stored in a memory or the like within main controller 50 without being deleted, the best focus position that is the data of the detection results is to be employed.

In the next step, step 310, the aerial image measurement of measurement mark PM by horizontal direction scan is performed. Specifically, while illuminating illumination light IL from illumination system 10 to measurement mark PM on measurement reticle Rm placed on reticle stage RST, Z tilt stage 38 is scanned and driven in the X-axis direction via stage controller 70 and wafer stage drive system 56W with respect to an image of measurement mark PM projected by projection optical system PL so that in the vicinity of an image plane of projection optical system PL, slit 122 of slit plate 190 is scanned in a predetermined measurement direction (in this case, in the X-axis direction). Then, by simultaneously loading an output signal from optical sensor 24 that is inputted via signal processing unit 80 during the scanning and driving and information on the position in the X-axis direction (the X position) of Z tilt stage 38 that is inputted via stage controller 70, at predetermined sampling intervals, an intensity signal (aerial image profile) of the image (aerial image) of measurement mark PM is obtained (i.e. the measurement of the aerial image is performed).

In the next step, step 312, based on the intensity signal of the aerial image obtained in step 310, gain setting (i.e. sensor calibration) of optical sensor 24 is performed. In other words, since measurement mark PM is a mark made up of an isolated line, there is the possibility that the output signal from optical sensor 24 cannot be obtained, in the case the Z position of slit plate 190 is too far from a best focus position.

Incidentally, the gain setting (gain adjustment) of optical sensor 24 in this case means that an appropriate circuit gain is set taking into consideration that the intensity of an aerial image at a best focus position becomes the maximum, so that an output signal of optical sensor 24 that is outputted due to receiving illumination light IL is not saturated (i.e. the intensity of illumination light IL does not exceed performance limit of optical sensor 24) and also the voltage at an electric circuit for obtaining the signal such as an A/D converter is not saturated. The gain adjustment is preferably performed based on results of the aerial image measurement by horizontal direction scan described earlier performed at the position in the vicinity of the best focus position, however, may be performed based on the aerial image measurement results obtained by aerial image measurement by horizontal direction scan performed at a Z position that is slightly deviated from the best focus position. In other words, in the case the maximum value of intensity of illumination light IL that optical sensor 24 receives at the best focus position can be predicted from a line width of measurement mark PM, taking into consideration that both of a light amount (total energy) of illumination light IL that optical sensor 24 receives when performing aerial image measurement by horizontal direction scan at the best focus position, and a light amount (total energy) of illumination light IL that optical sensor 24 receives when performing aerial image measurement by horizontal direction scan at a defocus position are not changed, an appropriate circuit gain can be set so that the saturation of the photoelectric conversion signal and voltage described above is not generated at the predicted maximum value of intensity of illumination light IL.

In the next step, step 314, the judgment is made of whether or not an appropriate gain can be set in the above step 312, and in the case the judgment is denied, the procedure shifts to step 316 and the Z position of slit plate 190 is changed according to the change procedures determined in advance, and after the change, the procedure returns to step 310, then the processing (including the judgment) of a loop of steps 310→312→314→316 is repeatedly performed until the judgment in the above step 314 is affirmed.

Incidentally, the change in the Z position of slit plate 190 in the above step 316 can be performed, for example, in the following procedures.

That is, on the first change, the Z position can be moved to a position $\Delta z$ distant apart from the initial position in the +Z direction; on the second change, moved to a position $\Delta z$ distant apart from the initial position in the −Z direction; on the third change, moved to a position $2 \times \Delta z$ distant apart from the initial position in the +Z direction; on the fourth change, moved to a position $2 \times \Delta z$ distant apart from the initial position in the −Z direction, and on the subsequent changes, moved to positions $3 \times \Delta z$ distant apart in the +Z direction and $3 \times \Delta z$ distant apart in the −Z direction . . . . Further, in the case it can be judged that a best focus position exists in either of the +Z direction or the −Z direction from the initial position based on results of the horizontal direction scan, the Z position can be moved by each $\Delta z$ ($\Delta z$, $2 \times \Delta z$, $3 \times \Delta z$ . . . ) in either of the +Z direction or the −Z direction from the initial position as the center.

Incidentally, in an exposure apparatus using a projection optical system of high NA, when performing measurement using a measurement mark having a thin line width, for example, equal to or narrower than 0.2 μm, $\Delta z$ (step pitch) described above is preferably set to a rather small value, for example, about 0.2 to 0.5 μm. This is because it can also be considered that the Z position of slit plate 190 (aperture pattern 122) is outside a range of a depth of focus (passes over a best focus position), for example, on the first change due to the narrow depth of focus when the value of $\Delta z$ (step pitch) is set to a rather great value.

On the other hand, in the case the judgment in the above step 314 is affirmed, that is, in the case appropriate gain setting of optical sensor 24 is possible from the beginning or in the case appropriate gain setting of optical sensor 24 becomes possible after the change of the Z position of slit plate 190, the procedure proceeds to step 318, in which aerial image measurement of the measurement mark by horizontal scan is performed in the similar manner to step 310 described earlier in a state after the gain setting, at the Z position of slit plate 190 where information used for the gain setting is obtained.

In the next step, step 320, based on an intensity signal (aerial image profile) of the image (aerial image) of measurement mark PM obtained in the above step 318, the projection position (X position) of measurement mark PM is detected. In this case, for example, a coordinate position (X position) in a measurement direction of a midpoint between two intersections of the aerial image profile (the aerial image profile has a mountain-like shape shown by reference numbers P1 to P7 in FIG. 5) with a predetermined slice level can be the projection position of measurement mark PM.

In the next step, step 322, the judgment is made of whether or not the intensity signal (aerial image profile) of the image (aerial image) of measurement mark PM obtained by the aerial image measurement in the above step 318 satisfies a threshold condition determined in advance. The threshold condition is a condition to confirm whether the current Z position of slit plate 190 is sufficiently closer to the best focus position of projection optical system PL enough to be a movement center at the time when performing Z scan measurement which will be described later.

Although the order of description is out of sequence, the Z scan measurement will be described next for the sake of convenience (from the viewpoint of facilitating the description below being understood). The Z scan in the embodiment is a measurement operation executed by main controller 50, which is an operation of moving Z tilt stage 38 in the optical axis AX direction (Z-axis direction) within a predetermined movement range via stage controller 70 and wafer stage drive system 56W while illuminating measurement mark PM of measurement reticle Rm mounted on reticle stage RST with illumination light IL from illumination system 10 in a state where the position of Z tilt stage 38 is set within the XY plane so that the X position of a projection center of an image (aerial image) of measurement mark PM coincides with the X position of a center of slit 122 of slit plate 190, and obtaining at predetermined sampling intervals position data of Z tilt stage 38 related to the Z-axis direction that is obtained based on the output of the multipoint focal position detection system (60a, 60b) and intensity data of the output signal of optical sensor 24 that is inputted via signal processing unit 80.

Figure 5:
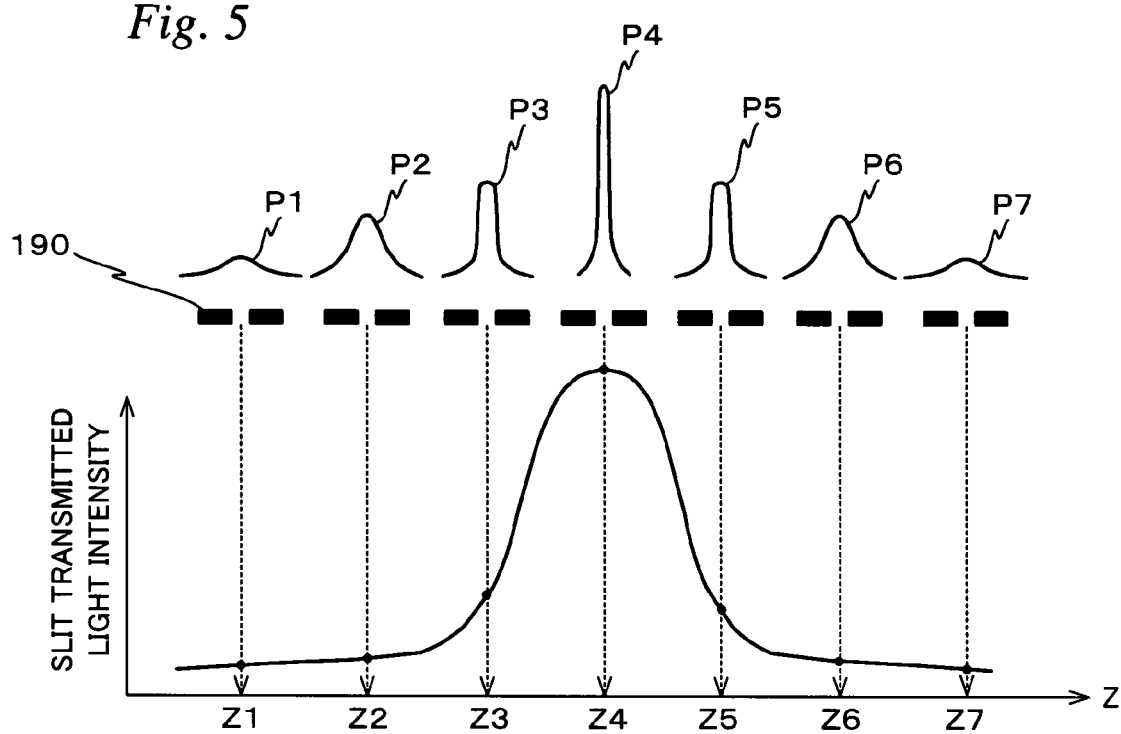
FIG. 5 is a view showing an aerial image profile of a measurement mark obtained by aerial image measurement by horizontal scan when a slit plate is located at different Z positions, and a change curve of slit transmitted light intensity obtained by Z scan measurement.
Figure 6:
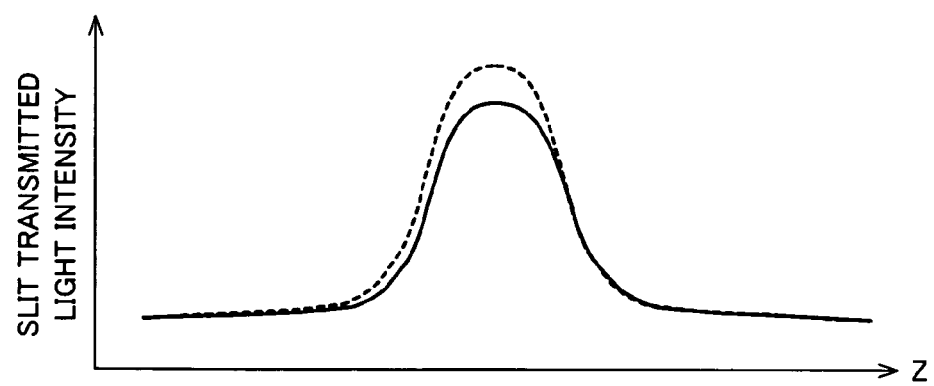
FIG. 6 is a view showing a relation between a change curve of slit transmitted light intensity obtained by Z scan measurement in a state where the position of a projection center of a projected image of a measurement mark PM is deviated from the position of a center of a slit 122 in a measurement direction (X-axis direction), and the change curve in a state where these two positions coincide with each other.

In the upper half section of FIG. 5, an aerial image profile of the measurement mark obtained by the aerial image measurement by horizontal scan described earlier is shown by the reference numbers P1 to P7 when slit plate 190 is located at the positions of Z1, Z2, . . . and Z7 respectively, and in the lower half section, a change curve (a curve that is obtained by plotting a point corresponding to intensity of illumination light IL that has passed through slit 122 (hereinafter shortened to 'slit transmitted light intensity') at each Z position on a coordinate system having the Z position as a horizontal axis) of slit transmitted light intensity with respect to the Z position of slit plate 190, which is obtained by the Z scan measurement, is shown. In FIG. 5, an aerial image profile P4 shows an aerial image profile at the time when slit plate 190 is located at the best focus position.

As is obvious from FIG. 5, it can be said that when the Z position of slit plate 190 is closer to the best focus position, an aerial image profile has a greater peak value of the image intensity distribution and the slit transmitted light intensity is increased.

Thus, as the threshold condition in step 322, a condition as to whether or not a peak value of the image intensity distribution in the aerial image profile obtained in step 318 exceeds a predetermined threshold determined in advance can be set.

Further, when the spacing between two intersections of each of aerial image profiles P1 to P7 with a predetermined slice level is defined as a line width of an aerial image (image of the mark), the line width becomes finer (narrower) when the Z position of slit plate 190 is closer to the best focus position. Accordingly, for this reason, as the threshold condition in step 322, a condition as to whether or not a line width of the image of the mark obtained from the aerial image profile obtained in step 318 is smaller than a threshold may be set. In general, it is known that a line width of a resist image that is obtained after transferring a certain pattern to a photoresist on a wafer and developing the wafer coincides with a distance between two intersections of an aerial image profile of the pattern with a predetermined slice level, and therefore, also from this point, it can be said that the definition of the line width described above is a correct definition.

The reason why the judgment as to whether or not the above threshold condition is satisfied is performed after the mark position detection in step 320 in the embodiment is as follows.

First, with regard to an aerial image profile obtained by aerial image measurement by horizontal scan at a Z position that is too far (defocused) from a best focus position, the signal intensity gently changes, and therefore, in the case a projection position (mark position) of measurement mark PM is computed from the aerial image profile (signal waveform), computation accuracy of the projection position of measurement mark PM is insufficient. Further, when aberration of the projection optical system is larger, the aerial image profile obtained by aerial image measurement by horizontal scan at the defocused Z position has asymmetry of the aerial image profile generated by effect of the aberration, and as a consequence, the false position due to the effect of the asymmetry is computed as the projection position (mark position) of measurement mark PM described earlier. Thus, in the case the position that is different from the actual mark position is computed as the mark position (the projection center of measurement mark PM) and Z scan measurement described above is performed later after making a slit center of slit plate 190 coincide with the different position, a change curve of slit transmitted light intensity obtained based on results of this Z scan measurement is deviated from a correct change curve (a change curve obtained in the case of performing the Z scan measurement later after making the slit center coincide with the mark position computed based on an aerial image profile without asymmetry). This point will further be described later.

In any case, since the mark position that is computed based on the aerial image profile obtained by aerial image measurement by horizontal scan at the defocused Z position lacks reliability, the confirmation is made as to whether the computed mark position has sufficient reliability by making the judgment as to whether or not the threshold condition described above is satisfied after the computation of the mark position.

Then, in the case the judgment in step 322 is denied, the procedure returns to step 316, and after the Z position of slit plate 190 is changed according to the procedures described earlier, the processing (including the judgment) of step 310 and the subsequent steps are repeated until the judgment in step 322 is affirmed.

Figure 4:
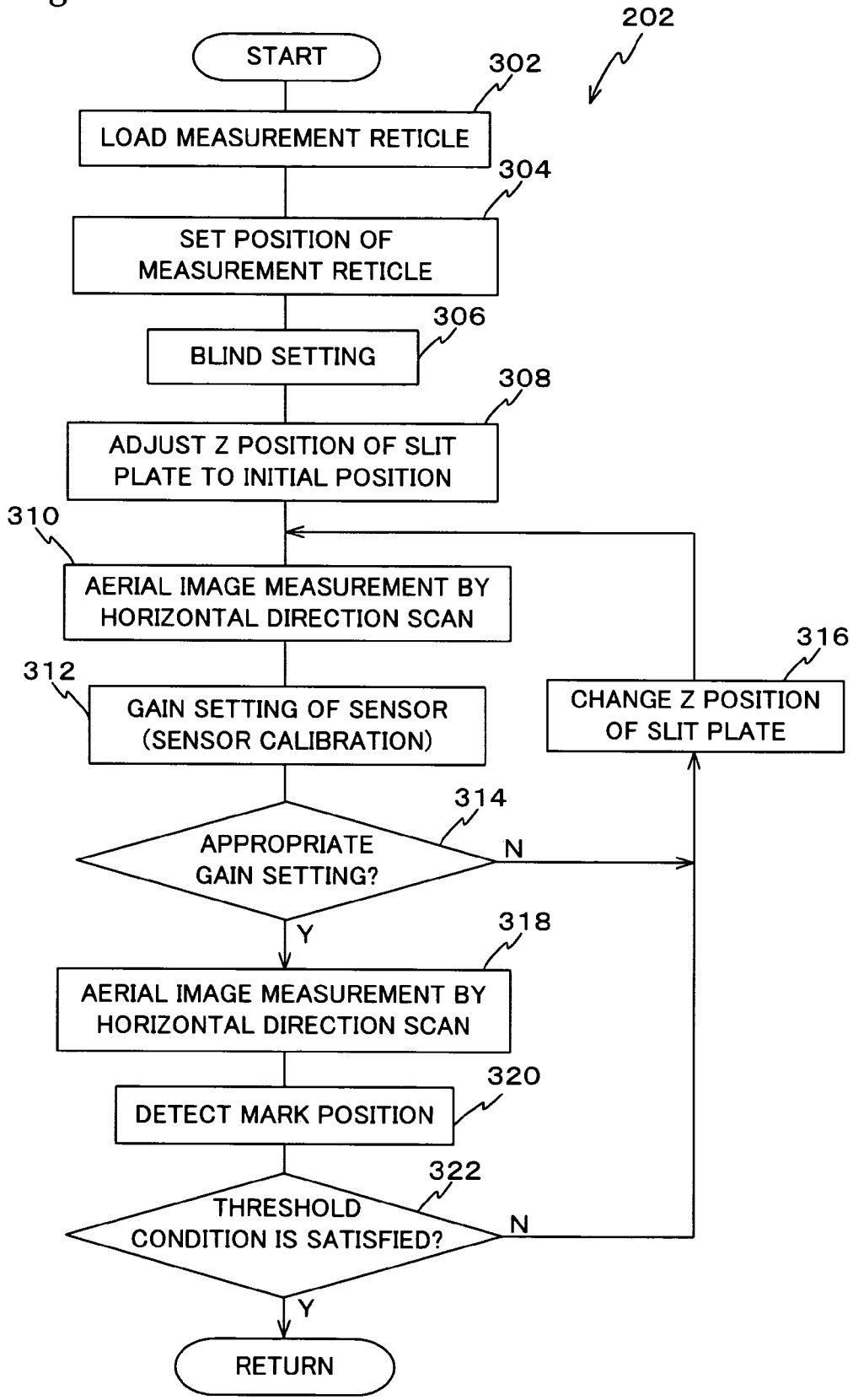
FIG. 4 is a flowchart showing a pre-measurement subroutine in FIG. 3.

Meanwhile, in the case the judgment in step 322 is affirmed, that is, in the case the aerial image profile of the measurement mark obtained in the above step 320 satisfies the threshold condition described above, the processing of pre-measurement subroutine 202 in FIG. 4 ends, and the procedure returns to step 204 of the main routine in FIG. 3.

At this stage, the gain setting of optical sensor 24 has been appropriately performed, and detection of a movement center on the Z scan measurement to be performed later has been completed, and the Z position of a surface of slit plate 190 has been set to the movement center.

In step 204, based on the mark position computed (detected) in step 320 described earlier, the position of slit plate 190 is set within the XY plane. The position setting in this case will be performed as follows. That is, at this stage, a Y position of slit plate 190 is substantially set to a position where an image (aerial image) of measurement mark PM is formed, and therefore an X position of slit plate 190 only has to be adjusted. Thus, by controlling the position of wafer stage WST within the XY plane via stage controller 70 and wafer stage drive system 56W so that an X position of a projection center of an image of measurement mark PM substantially coincides with an X position of the center of slit 122 of slit plate 190, as a consequence, the position of slit plate 190 is set to a position where the projection center of the image of measurement mark PM coincides with the center of slit 122 in at least the X-axis direction, within the XY plane.

The reason why the position setting as described above is performed will be explained next. In the case Z scan measurement is performed later in a state where the position in the measurement direction (X-axis direction) of the projection center of the image of measurement mark PM is deviated from that of the center of slit 122, a change curve of slit transmitted light intensity obtained by the Z scan measurement becomes a curve shown by a solid line in FIG. 6, and is deviated from a change curve of correct slit transmitted light intensity (a change curve of slit transmitted light intensity that is obtained by Z scan measurement in a state where the position in the measurement direction (X-axis direction) of the center of an image of measurement mark PM coincides with that of the center of slit 122) shown by a dotted line in FIG. 6 (in this case, the height of the mountain is lower). In this case, when a best focus position is computed based on the change curve shown by a solid line, the computation result has errors inevitably, and therefore, in order to avoid occurrence of such inconvenience, the position setting described above needs to be performed.

Incidentally, when aberration of the projection optical system is larger and a defocus amount of a Z position of the slit plate, at which horizontal direction scan is performed on the computation of the mark position described earlier, is larger, a deviation of the change curve of slit transmitted light intensity shown by a solid line with respect to the change curve of slit transmitted light intensity shown by a dotted line becomes larger. Accordingly, also in this regard, the judgment (confirmation) in step 322 described earlier has significance.

In the next step, step 206, the Z scan measurement described earlier is performed while maintaining the position setting state described above of slit plate 190 within the XY plane. In other words, main controller 50 moves Z tilt stage 38 in the optical axis AX direction (Z-axis direction) within a predetermined movement range via stage controller 70 and wafer stage drive system 56W while illuminating measurement mark PM of measurement reticle Rm mounted on reticle stage RST with illumination light IL from illumination system 10 in a state where the position of Z tilt stage 38 is set within the XY plane so that the X position of the projection center of the image (aerial image) of measurement mark PM coincides with the X position of the center of slit 122, and then obtains position data of Z tilt stage 38 related to the Z-axis direction obtained based on an output of the multipoint focal position detection system (60a, 60b) and intensity data of an output signal of optical sensor 24 inputted via signal processing unit 80, at predetermined sampling intervals during the movement. At this point of time, main controller 50 uses the Z position of a surface of slit plate 190 that is set when performing the position setting in step 204 above (i.e. the Z position set at the stage when the pre-measurement described earlier ends) as a movement center, and moves Z tilt stage 38 within a range having a predetermined width using the movement center as its center, while monitoring the output of the multipoint focal position detection system (60a, 60b).

The reason why Z tilt stage 38 is moved in the Z-axis direction within the range having a predetermined width using the movement center as its center will be described next.

Figure 7A:
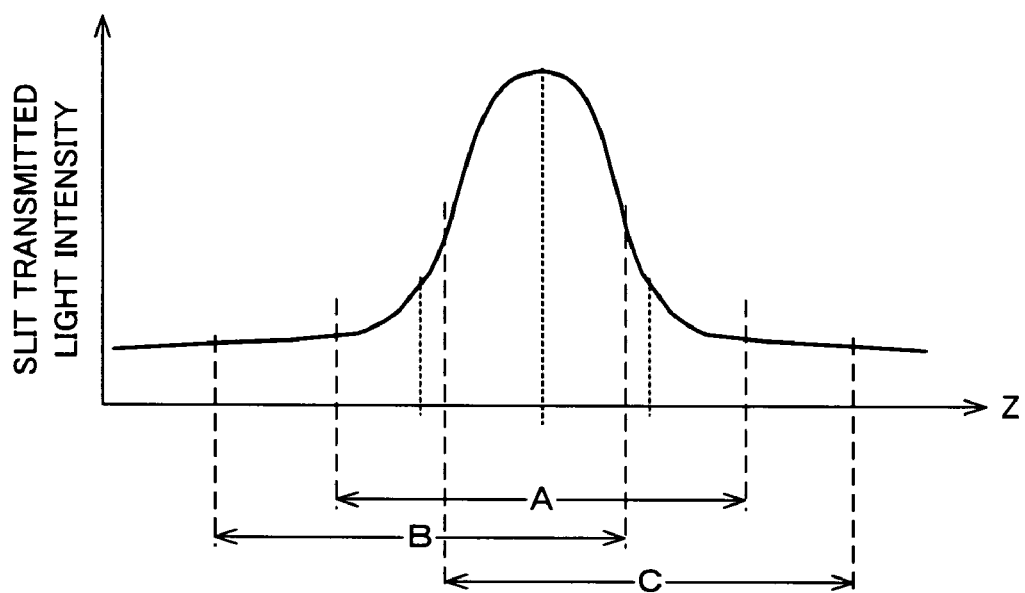
FIG. 7A is a view showing a relation between a Z position and slit transmitted light intensity obtained in Z scan measurement.

FIG. 7A shows a relation between the Z position obtained in Z scan measurement and slit transmitted light intensity. As is shown in FIG. 7A, when Z scan measurement is performed within a predetermined range A that has the Z position where the slit transmitted light intensity becomes the maximum as its center, a change curve of slit transmitted light intensity that has a symmetric mountain-like shape can be obtained. On the contrary, Z scan measurement is performed within a predetermined range B or C that has a position far from the position where the slit transmitted light intensity becomes the maximum as its center, a change curve of slit transmitted light intensity that has an asymmetric mountain-like shape is obtained.

Figure 7B:
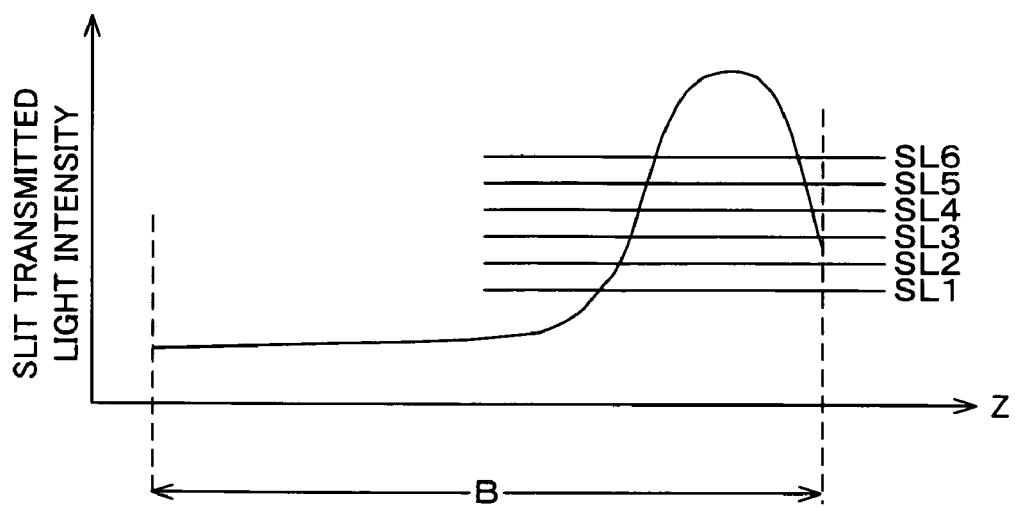
FIG. 7B is a view used to explain inconvenience occurred in the case a range where Z scan is performed is inappropriately set.

For example, in the case Z scan measurement is performed using a point that is deviated too far from the Z position where the slit transmitted light intensity becomes the maximum similarly to range B in FIG. 7A, a change curve of slit transmitted light intensity as shown in FIG. 7B is obtained. Concerning the change curve in FIG. 7B, for example, in the case a method (hereinafter referred to as 'slice method') is employed in which a midpoint between two intersections of the change curve with a slice level is obtained and the Z position of the midpoint is made to be a best focus position, for example, there is the possibility that only one intersection with the change curve can be obtained as slice levels SL1 and SL2 of slice levels SL1 to SL6 in FIG. 7B depending on the setting of slice levels, and in such a case, it becomes difficult to compute a best focus position. In order to avoid occurrence of such a problem without fail, in the embodiment, a position in the vicinity of the best focus position where the slit transmitted light intensity becomes the maximum is determined as a Z position to be the movement center of slit plate 190 at the stage of the pre-measurement described earlier, and also Z tilt stage 38 is driven so that slit plate 190 is moved in the Z-axis direction within a range having a predetermined width using the movement center as its center.

In the embodiment, when performing the Z scan measurement described above, as the sampling interval described above, for example, an sampling interval of 4 kHz, which is the same as an oscillation frequency (repetition frequency) of the light source (excimer laser) within illumination system 10 can be employed. In this case, for example, even when the sampling is performed while moving slit plate 190 (Z tilt stage 38) by 8 μm/sec, the position data described above of the slit plate related to the Z-axis direction can be obtained with a resolution of 8000 [nm/sec]/4000 [Hz]=2 [nm]. Further, even when a range having a predetermined width with the movement center as its center is set to a range having a width of 4 μm, measurement can be performed in a remarkably short period of time, i.e. 4 [μm]/8 [μm/sec]=0.5 [sec].

In the next step, step 208, based on a plurality of position data obtained at predetermined sampling intervals and a plurality of intensity data obtained at the predetermined sampling intervals in the above step 206, a best focus position of the projection optical system PL is computed. In this case, smoothing of at least one of the plurality of position data and the plurality of intensity data is performed at least once using moving average, and a change curve of intensity of illumination light IL with respect to the Z position of slit plate (pattern plate) 190 is computed using each data of the position data and the intensity data after smoothing, and the best focus position is computed based on the change curve.

The computation method of the best focus position described above will be explained next with reference to FIGS. 8A to 11.

Figure 8A:
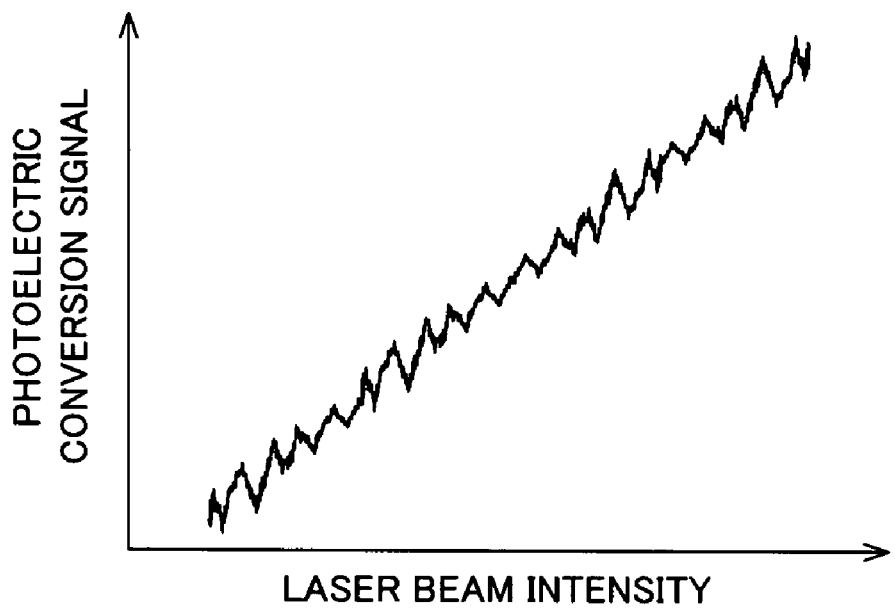
FIG. 8A is a view showing an example of a photoelectric conversion signal of an optical sensor before moving average processing.
Figure 9A:
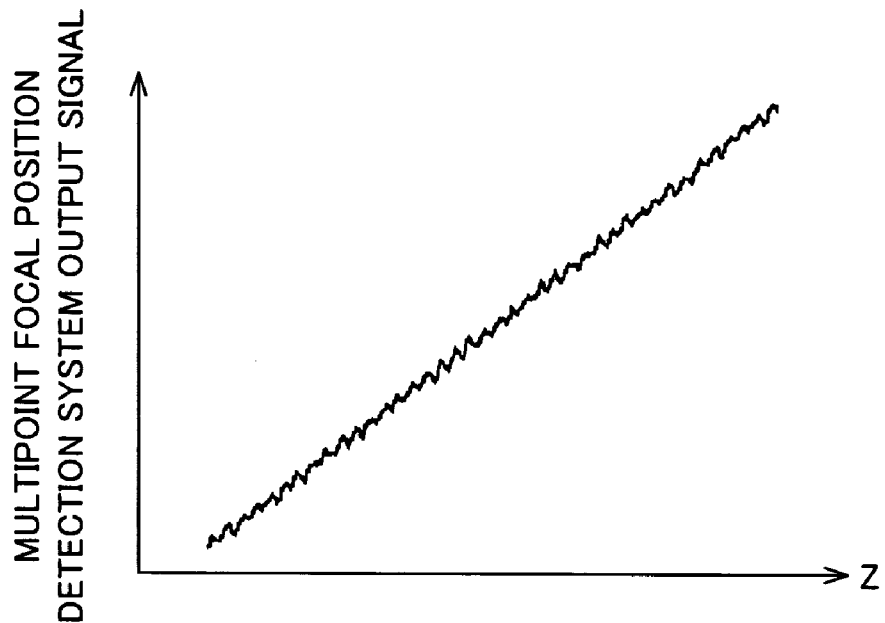
FIG. 9A is a view showing an example of an output signal of a multipoint focal position detection system before moving average processing.

Since a signal waveform obtained by the Z scan measurement described earlier includes noise components due to intensity noise of the signal, vibration due to disturbance added to the apparatus itself and resonance of the apparatus itself, the output property of a photoelectric conversion signal of optical sensor 24 of photodetector 94 that receives illumination light IL via slit 122 has, as an example, a saw-like waveform as shown in FIG. 8A. Further, since the output signal of the multipoint focal point detection system (60a, 60b) that performs sensing of the position (focus position) in the Z-axis direction of slit plate 190 also includes noise components, the output property of the multipoint focal position detection system (60a, 60b) has, as an example, a waveform as shown in FIG. 9A.

Figure 10A:
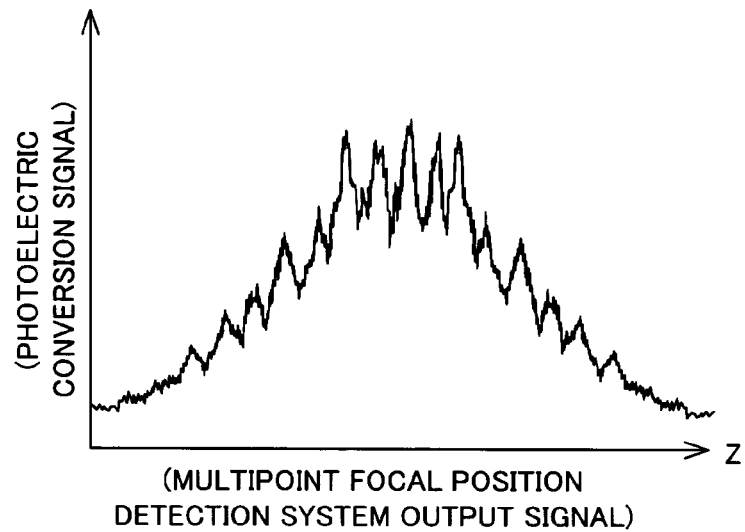
FIG. 10A is a view showing an example of a change curve of slit transmitted light intensity obtained by Z scan measurement before moving average processing.

Therefore, the change curve of slit transmitted light intensity that is computed from the intensity data outputted from optical sensor 24 of photodetector 94 and the position data from the multipoint focal position detection system (60a, 60b) has, as an example, a waveform as shown in FIG. 10A. Based on such a waveform as shown in FIG. 10A, it is difficult to compute a best focus position.

Accordingly, the waveform as shown in FIG. 10A needs to be smoothed in order to remove the noise components. However, since the position of slit plate 190 always moves in the Z-axis direction during Z scan measurement, the noise components cannot be removed by performing normal averaging to the position data and the intensity data at a certain focus position. Thus, in the embodiment, moving average of each predetermined point in accordance with a change amount of the focus position is performed to at least one of the position data and the intensity data.

Figure 8B:
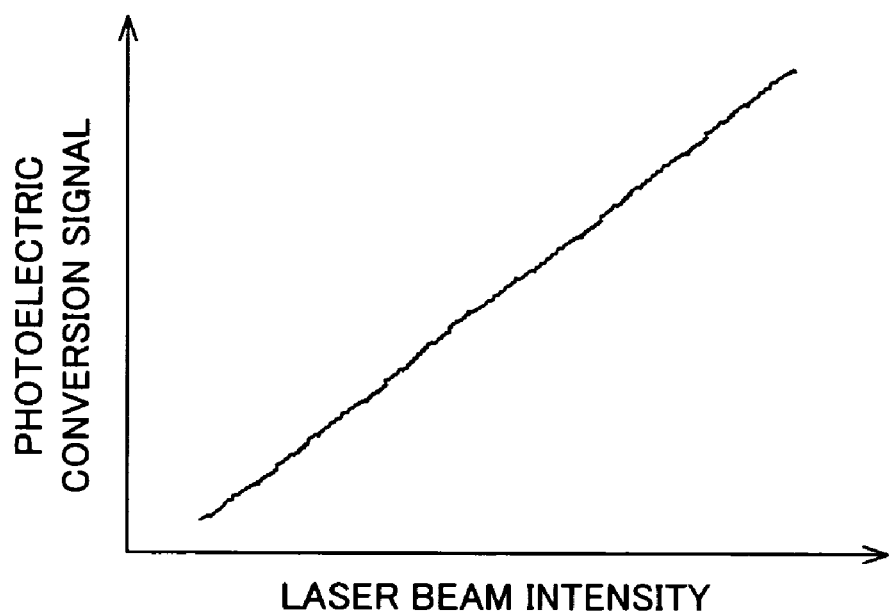
FIG. 8B is a view showing the photoelectric conversion signal in FIG. 8A after moving average processing.
Figure 9B:
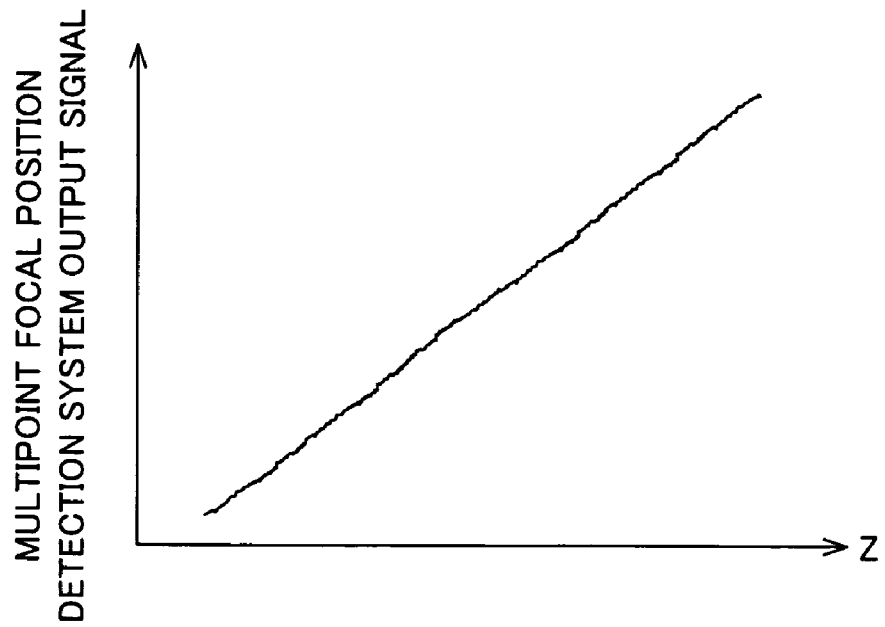
FIG. 9B is a view showing the output signal in FIG. 9A after moving average processing.
Figure 10B:
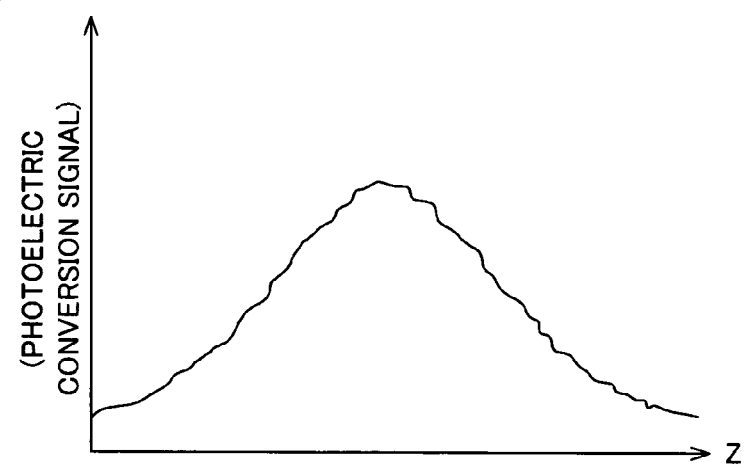
FIG. 10B is a view showing a change curve of slit transmitted light intensity obtained after performing moving average processing once to the change curve in FIG. 10A.

By performing the moving average, the photoelectric conversion signal waveform from optical sensor 24 is smoothed as shown in FIG. 8B, and the output signal waveform from the multipoint focal position detection system (60a, 60b) is smoothed as shown in FIG. 9B, and as a consequence, the change curve of slit transmitted light intensity has a waveform as shown in FIG. 10B. When comparing FIG. 10B with FIG. 10A, it can be seen that the waveform shown in FIG. 10A is smoothed to the waveform in FIG. 10B by the moving average referred to above.

Further, in the embodiment, the number of averaging points of moving average is severally determined based on the frequency of 'characteristic noise' of the noise components included in the photoelectric conversion signal from optical sensor 24 or the output signal from the multipoint focal position detections system (60a, 60b). For example, as is described earlier, in the case the light source (excimer laser) is made to emit a pulse light with frequency of 4 kHz and the sampling of aerial image intensity is performed at each emission timing of the excimer laser, when the frequency of characteristic noise is 100 Hz, the moving average is to be performed with respect to each 40-point that is a value obtained by dividing the sampling frequency 4 kHz by the frequency of the characteristic noise 100 Hz.

Figure 10C:
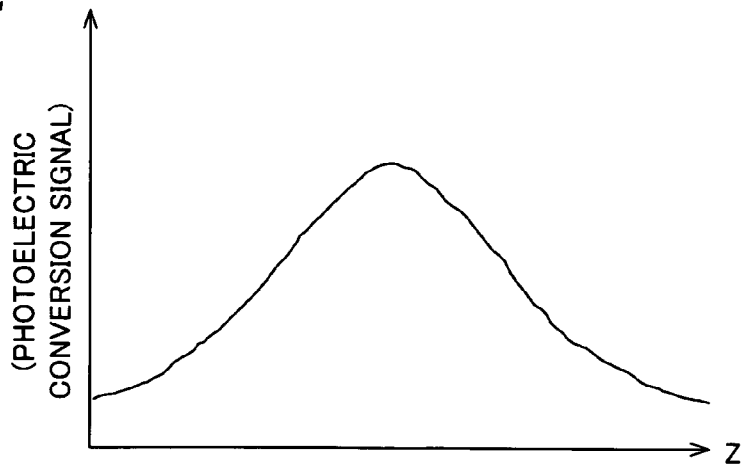
FIG. 10C is a view showing a change curve of slit transmitted light intensity obtained after performing moving average processing twice to the change curve in FIG. 10A.

Incidentally, the moving average may be repeatedly performed twice or more times (a plurality of times), and in the case there are the characteristic noise components in plural, the moving average in accordance with the frequency of each noise component may be performed with respect to each noise component a plurality of times that are the same as the number of the characteristic noise components. FIG. 10C shows a change curve (signal waveform) of slit transmitted light intensity after performing the moving average a plurality of times. In the waveform of FIG. 10C, it can be seen that effects due to the noise components are reduced compared with the waveform in FIG. 10B to which the moving average is performed only once.

Then, based on the change curve (signal waveform) of slit transmitted light intensity obtained after performing the moving average, a best focus position of projection optical system PL is computed in the following manner.

Figure 11:
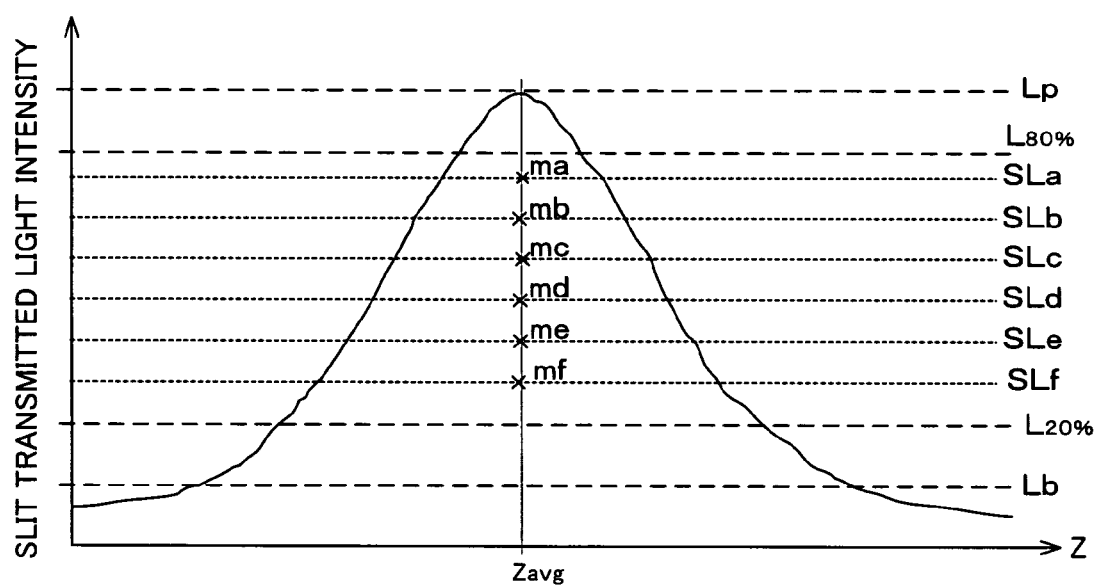
FIG. 11 is a view used to explain a detection method of a best focus position.

That is, a best focus position of projection optical system PL is computed in the slice method described earlier using one slice level or a plurality of slice levels. For example, in the case of using a plurality of slice levels, a midpoint between respective two intersections of each slice level with a change curve of slit transmitted light intensity (a midpoint of a line segment that is set by respective two intersections) is severally computed. FIG. 11 shows midpoints ma to mf computed with respect to each of six slice levels SLa to SLf.

Then, an average value $Z_{avg}$ of the Z positions of midpoints ma to mf is computed as a best focus position $Z_{best}$ of projection optical system PL.

In this case, the section near the top (near the best focus position) and the foot section of the change curve of slit transmitted light intensity are avoided, and the slice levels (SLa to SLf) are preferably set within a range in which the slice levels intersect with the change curve of slit transmitted light intensity in a section between the top and the foot sections where the ratio of change in slit transmitted light intensity with respect to the Z position change is large. This is because the rate of the noise components included in the change curve of slit transmitted light intensity increases in a section near the best focus position and the noise components are dominant in the intensity data in this section, and therefore this section is preferably avoided, and in the foot section of the change curve of slit transmitted light intensity, the intensity value is too small.

Accordingly, for example, as is shown in FIG. 11, when a bottom level Lb is to be 0% and a peak level Lp is to be 100%, slice levels SLa to SLf are preferably set between a straight line $L_{20\%}$ showing a peak level 20% and a straight line $L_{80\%}$ showing a peak level 80%.

As is described above, after best focus position $Z_{best}$ of projection optical system PL is computed in step 208, the value of best focus position $Z_{best}$ is stored in an internal memory, and a series of processing of the main routine ends.

Incidentally, when the foregoing detection of the best focus position is completed, main controller 50 unloads measurement reticle Rm from reticle stage RST via a reticle transport system (not shown).

In exposure apparatus 100 of the embodiment, main controller 50 executes adjustment or calibration of the multipoint focal position detection system (60a, 60b) based on best focus position $Z_{best}$ obtained in the manner described above. In this case, as adjustment of the multipoint focal position detection system, a detection origin of each sensor can be adjusted, as disclosed in, for example, Kokai (Japanese Unexamined Patent Application Publication) No. 2002-014005 and No. 2002-019830, and the corresponding U.S. Patent Application Publication No. 2002/0041377, and the like. As long as the national laws in designated states (or elected states), to which this international application is applied, permit, the above disclosures of the publications and the U.S. Patent Application Publication are incorporated herein by reference.

In exposure apparatus 100 of the embodiment that is configured as is described above and has the functions as described above, main controller 50 controls the respective sections, and reticle loading, wafer loading, reticle alignment and baseline measurement of alignment system ALG, and wafer alignment such as EGA are performed in the same procedures as in a normal scanning stepper.

After that, main controller 50 controls the respective sections as will be described below, and exposure by a step-and-scan method is performed, and a pattern of reticle R is transferred to each of a plurality of shot areas on wafer W.

In other words, main controller 50 moves Z tilt stage 38 (wafer stage WST) to a scanning starting position (acceleration starting position) for exposure of a first shot area of wafer W and also moves reticle stage RST to a scanning starting position (acceleration starting position) while monitoring position information from interferometers 54W and 54R, based on array information of shot areas on wafer W obtained as a result of wafer alignment and on the baseline of alignment system ALG, and then starts relative scanning of both stages RST and WST in the Y-axis direction.

Then, when both stages RST and WST reach a predetermined scanning velocity and move in a constant velocity synchronous state, illumination light IL from illumination system 10 begins to illuminate a pattern area of reticle R and scanning exposure of the first shot area is started. Next, by different areas in the pattern area of reticle R sequentially being illuminated with illumination light IL and illumination to the entire surface of the pattern area being completed, scanning exposure of the first shot area on wafer W is completed. With this operation, a circuit pattern of reticle R is reduced and transferred to the first shot area via projection optical system PL.

Main controller 50 performs synchronous control of reticle stage RST and wafer stage WST via stage controller 70 so that movement velocity Vr in the Y-axis direction of reticle stage RST and movement velocity Vw in the Y-axis direction of wafer stage WST are maintained to a velocity ratio in accordance with the projection magnification of projection optical system PL, during the scanning exposure described above. Further, during the scanning exposure above, main controller 50 performs focus leveling control for substantially conforming an image-forming plane (best image-forming plane) of projection optical system PL to a surface of wafer W within an exposure area that is an irradiation area of illumination light IL, by adjusting the position of wafer W in the optical axis AX direction of projection optical system PL and an inclination with respect to the XY plane (i.e. rotation in the θx and θy directions) based on a focal point deviation signal from photodetection system 60b, using the multipoint focal position detection system (60a, 60b) that is adjusted based on detected best focus position $Z_{best}$ described above.

In this manner, when the scanning exposure to the first shot area ends, main controller 50 performs a stepping operation between shots for moving wafer stage WST to a scanning starting position (acceleration starting position) for next exposure of a second shot area and performs scanning exposure to the second shot area similar to the scanning exposure described above.

Afterwards, main controller 50 repeats the stepping operation between shots and the scanning exposure operation described above and a pattern of reticle R is transferred in the step-and-scan method to all shot areas on wafer W.

Incidentally, in the embodiment above, adjustment of the multipoint focal position detection system (60a, 60b) is performed based on the best focus position detected beforehand of the projection optical system and focus leveling control of wafer W is performed using the adjusted multipoint focal position detection system (60a, 60b) during scanning exposure. However, the present invention is not limited to this, and a detection offset value of the multipoint focal position detection system (60a, 60b) is obtained using the best focus position detected beforehand of the projection optical system and focus leveling control of wafer W may be performed during scanning exposure taking into consideration the detection offset value and the output of the multipoint focal position detection system (60a, 60b).

As is described above, with the best focus detection method that is executed in exposure apparatus 100 of the embodiment, by scanning slit plate 190 in the X-axis direction with respect to an image (aerial image) of measurement mark PM by projection optical system PL while illuminating measurement mark PM formed on measurement reticle Rm with illumination light IL, and receiving illumination light IL via slit 122 during the scanning, position information in the X-axis direction of the image of measurement mark PM is detected. Then, position data and intensity data of illumination light IL (slit transmitted light) that has passed through slit 122 are obtained at predetermined sampling intervals by scanning slit plate 190 in the Z-axis direction while illuminating measurement mark PM with illumination light IL in a state where the position of slit plate 190 is set within the XY plane (in the X-axis direction in particular) based on the detection results described above. And, based on a plurality of position data and a plurality of intensity data of slit transmitted light that are obtained, a best focus position of projection optical system PL is computed. In this case, each of the foregoing data can be obtained while continuously moving slit plate 190 in the optical axis direction (Z-axis direction). Accordingly, by a combination of one scanning of slit plate 190 within a two-dimensional plane orthogonal to the optical axis of projection optical system PL with one scanning of slit plate (pattern plate) 190 in the optical axis direction of projection optical system PL after the former scanning, data used to compute a best focus position of projection optical system PL can be obtained. Thus, since it is not necessary to change the position of slit plate (pattern plate) 190 to multiple positions in the optical axis direction and to scan slit plate 190 at each position as in the conventional example described earlier, the measurement time can remarkably be shortened. Further, by setting the sampling intervals described above as detailed as possible, lots of data can be obtained, and therefore improvement in detection accuracy (detection resolution) of the best focus position is also expected.

Further, with the exposure method and exposure apparatus of the present invention, a best focus position of projection optical system PL is detected using the best focus detection method of the present invention and the position of wafer W in the optical axis direction of projection optical system PL is adjusted using the detection results, and then a pattern formed on reticle R is transferred onto wafer W whose position in the optical axis direction is adjusted, via projection optical system PL. Accordingly, since detection of the best focus position is performed in a short period of time, throughput in all processes including the detection of the best focus position and an exposure process can be improved. Further, as is described earlier, since detection accuracy of the best focus position of projection optical system PL can also be improved, transfer with high accuracy of a pattern onto wafer W with very few exposure defects due to defocus can be performed as a consequence.

Further, since computation of the best focus position from the slit transmitted light intensity is performed based on a change curve obtained after moving average is performed to a change curve of slit transmitted light intensity, detection of the best focus position with high accuracy can be performed without being affected by noise components included in the photoelectric conversion signal from optical sensor 24 of photodetector 94 and noise components included in the signal from the multipoint focal position detection system (60a, 60b).

Further, since computation of the best focus position from the change curve of slit transmitted light intensity is performed based on a midpoint between two intersections of a slice level, which is set in an area other than an area in the vicinity of the maximum level of the slit transmitted light intensity including many noise components and than an area in the vicinity of the minimum level where the intensity of slit transmitted light is small, with the change curve of slit transmitted light intensity, the best focus position can be detected with good accuracy.

Further, in the embodiment, since a plurality of slice levels are set and the best focus position is determined from a plurality of midpoints that are derived from the intersections of each slice level with the change curve of slit transmitted light intensity, the best focus position can be detected with good accuracy.

Further, in the embodiment, detection of the best focus position is performed after gain adjustment of optical sensor 24 is performed and the judgment is made that appropriate gain setting can be performed in the pre-measurement subroutine that is performed prior to measurement of the best focus position, and therefore, the best focus position can be detected with higher accuracy.

Further, in the embodiment, in the case the judgment in step 322 is denied, the gain setting of optical sensor 24 is performed again after changing the Z position of slit plate 190, and therefore, the gain setting with high accuracy can be performed based on the aerial image measurement result at a position closer to the best focus position as a consequence.

Incidentally, in the embodiment above, the Z position of the wafer is adjusted using the multipoint focal position detection system (60a, 60b) that is adjusted or calibrated based on the detection result of the best focus position. However, the present invention is not limited to this method, and the following method may be employed.

That is, for example, using the method similar to the detection method of a best focus position in the embodiment above, detection of slit transmitted light intensity and detection of a best focus position of projection optical system PL with respect to measurement mark PM are repeatedly performed while changing an evaluation point within a field of projection optical system PL. Incidentally, when measuring a best focus position at a second and succeeding evaluation points, measurement of slit transmitted light intensity is performed while performing scanning in the Z direction using the best focus position(s) obtained so far as the center.

Then, a shape of image plane (or a curvature of image plane) of projection optical system PL is computed by performing predetermined statistical processing based on the best focus position at each evaluation point. At this point of time, an inclination of image plane may be computed together. When performing exposure, exposure is performed using projection optical system PL whose image-forming property is adjusted based on the computed curvature of image plane, and in the case the inclination of image plane is computed, an inclination of wafer W may be adjusted in accordance with the inclination of image plane. Incidentally, in the case measurement of the shape of image plane and the like described above is performed, a plurality of measurement marks need to be placed, for example, two-dimensionally on measurement reticle Rm beforehand, or a configuration in which reticle stage RST can be moved in a long stroke in two-dimensional directions is employed and one mark or two or more marks need(s) to be movable to an arbitrary position within the field of the projection optical system.

Incidentally, in the embodiment above, the threshold condition in step 322 in FIG. 4 is either of the condition that the maximum value of intensity signal (aerial image profile) of an image (aerial image) of measurement mark PM obtained by aerial image measurement exceeds a predetermined threshold or the condition a line width of an image (aerial image) becomes smaller than a predetermined threshold. However, the present invention is not limited to these conditions, and as the threshold condition, a condition that contrast of intensity signal of an image (aerial image) of the mark exceeds a predetermined threshold may be set. Or, as the threshold condition, an arbitrary combination of two of the following three conditions or a combination of the three conditions may be set: a condition that the maximum value of intensity signal (aerial image profile) of an image (aerial image) of the mark exceeds a predetermined threshold, a condition that contrast of intensity signal of an image (aerial image) of the mark exceeds a predetermined threshold, and a condition a line width of an image (aerial image) the mark becomes smaller than a predetermined threshold.

Incidentally, in the embodiment above, the gain setting of optical sensor 24 is performed in the pre-measurement subroutine. However, the present invention is not limited to this, and the sensor gain getting not always has to be performed.

Incidentally, in the embodiment above, the case has been described where a plurality of slice levels as shown in FIG. 11 are used and a value obtained by averaging a plurality of midpoint values that are derived from intersections of each slice level with the change curve of transmitted light intensity is obtained as a best focus position in order to detect the best focus position. However, the present invention is not limited to this, and one slice level is set and a value measured using the slice level may be obtained as a best focus position.

Incidentally, in the embodiment above, measurement reticle Rm on which a mark is formed is used when a best focus position is detected. However, the present invention is not limited to this, and measurement mark PM may be arranged on a part of a reticle for exposure. Further, a fiducial mark plate is arranged on reticle stage RST and a plurality of measurement marks PM may be formed on the fiducial mark plate.

Incidentally, in the embodiment above, an isolated pattern is used as measurement mark PM. However, the present invention is not limited to the isolated pattern, and a line-and-space pattern may be used. In this case, measurement of a best focus position may be performed basically as follows.

Figure 12A:
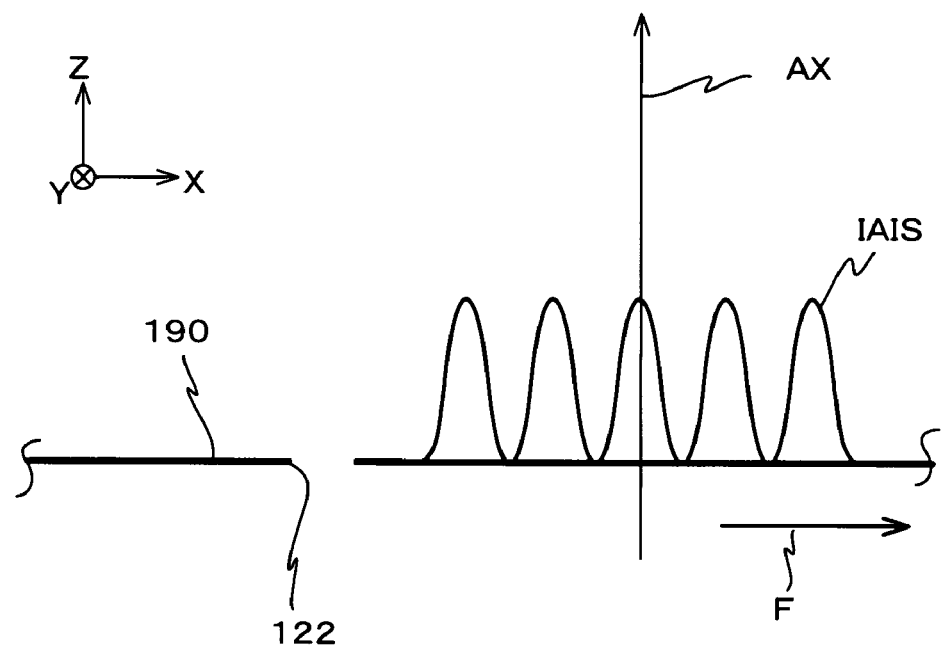
FIG. 12A is a view (No. 1) used to explain an operation of measuring a best focus position using a line-and-space pattern.

First, as is shown in FIG. 12A, after slit plate 190 is moved so that slit 122 is located at an end portion in a periodic direction (e.g. the X-axis direction) of an image IAIS of a line-and-space pattern, light intensity is measured by scanning image IAIS of the line-and-space pattern in a measurement direction that is parallel to the periodic direction with slit 122 by moving slit plate 190 in an arrow F direction. Then, in the case the line-and-space pattern is odd in number, a center position of light intensity distribution of image IAIS of the pattern is measured.

Figure 12B:
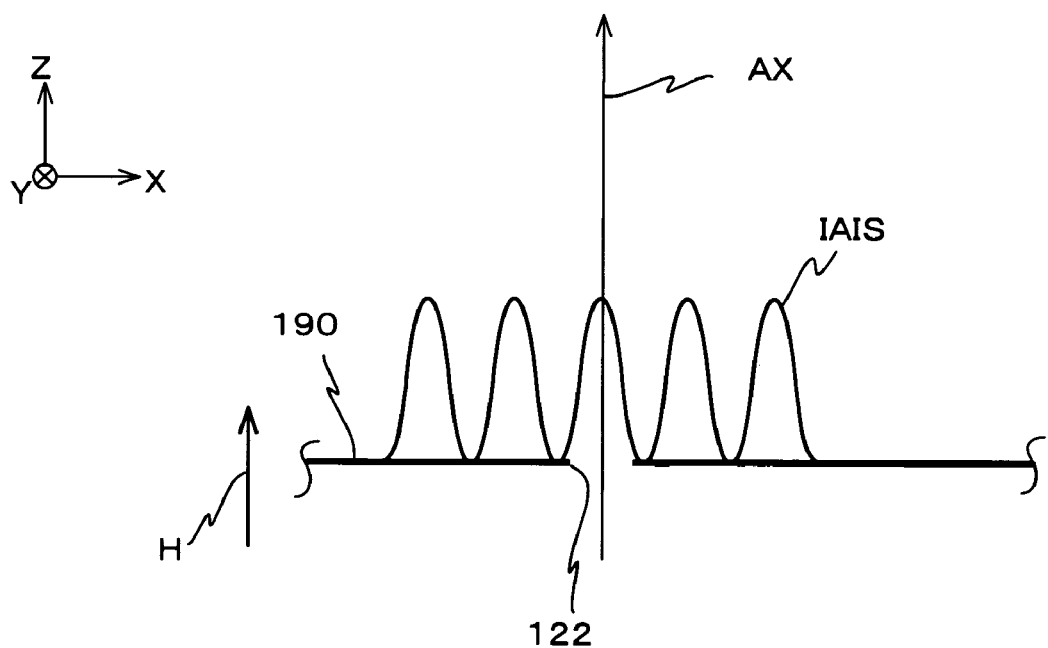
FIG. 12B is a view (No. 2) used to explain an operation of measuring a best focus position using a line-and-space pattern.

Next, as is shown in FIG. 12B, after slit 122 is located at a peak position of the light intensity distribution of image IAIS of the pattern, measurement that is similar to the case of Z scan measurement with respect to an image of measurement mark PM described earlier is performed by scanning slit plate 190 (slit 122) in a direction (Z-axis direction) that is parallel to optical axis AX of the projection optical system as is shown by an arrow H while measuring light intensity detected via slit 122.

When projecting an image of an isolated pattern or an image of a line-and-space pattern on an image plane via the projection optical system, an aperture stop of the projection optical system is adjusted so that the image is formed by three-beams interference by three beams of a zero order beam, a minus first order diffracted beam and a plus first order diffracted beam, and other diffracted beams (plus second and subsequent order diffracted beams, and minus second and subsequent order diffracted beams) may be prevented from passing through a pupil of the projection optical system by the aperture stop. Thus, in the case an image of the pattern is formed by three beam interference, third and subsequent order harmonic wave components (noise components) included in an intensity signal of a projected image (aerial image) can be reduced.

In the embodiment above, the configuration in which one wafer stage WST is placed on an image plane side of the projection optical system, and on wafer stage WST, a wafer is mounted and also a part of the optical system that constitutes a part of aerial image measurement unit 59 is placed has been described, however, the present invention is not limited to this configuration. For example, in addition to wafer stage WST, another stage is arranged, on which a part of the optical system that constitutes a part of aerial image measurement unit 59 may be placed.

Further, in the embodiment above, the case has been described where an ArF excimer laser beam (193 nm) is used as illumination light for exposure. However, the illumination light for exposure is not limited to the ArF excimer laser beam, and a KrF excimer laser beam (248 nm), an $F_2$ laser beam (157 nm), a g-line (436 nm), an i-line (365 nm), an $Ar_2$ laser beam (126 nm), a harmonic wave such as a copper vapor laser and a YAG laser, or the like can be used as the illumination light for exposure. Further, for example, as a vacuum ultraviolet light, a harmonic wave may be used that is obtained by amplifying a single-wavelength laser beam in the infrared or visible range emitted by a DFB semiconductor laser or fiber laser, with a fiber amplifier doped with, for example, erbium (Er) (or both erbium and ytteribium (Yb)), and by converting the wavelength into ultraviolet light using a nonlinear optical crystal.

Further, in the embodiment above, illumination light IL of the exposure apparatus is not limited to the light having a wavelength equal to or more than 100 nm, and it is needless to say that the light having a wavelength less than 100 nm may be used. For example, in recent years, in order to expose a pattern equal to or less than 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective type mask has been developed. Besides, for example, the present invention can also be applied to an immersion exposure apparatus that has liquid filled in between projection optical system PL and a wafer, which is disclosed in, for example, the pamphlet of International Publication WO 2004/053955 and the like.

Further, in the embodiment above, the case has been described where the present invention is applied to the exposure apparatus used for manufacturing semiconductors. The usage of the present invention is not limited to the exposure apparatus used for manufacturing semiconductors and the present invention can also be applied to an exposure apparatus for manufacturing displays including liquid crystal display devices which transfers a device pattern onto a glass plate, to an exposure apparatus for manufacturing thin-film magnetic heads which transfers a device pattern onto a ceramic wafer, and to an exposure apparatus for manufacturing imaging devices (such as CCDs), organic EL, micromachines, DNA chips or the like. Further, the present invention can also be applied to an exposure apparatus that transfers a circuit pattern onto a glass substrate or a silicon wafer not only when producing microdevices such as semiconductors, but also when producing a reticle or a mask used in an exposure apparatus such as an optical exposure apparatus, an EUV exposure apparatus, an X-ray exposure apparatus, or an electron beam exposure apparatus. In this case, in the exposure apparatus that uses a DUV (far ultraviolet) light or a VUV (vacuum ultraviolet) light, a transmittance type reticle is used in general, and as the reticle substrate, materials such as silica glass, fluorine-doped silica glass, fluorite, magnesium fluoride, or crystal are used. In the X-ray exposure apparatus by the proximity method or the electron beam exposure apparatus, a transmittance type mask (a stencil mask, a membrane mask) is used, and as the mask substrate, a silicon wafer or the like is used.

Further, the illumination optical system constituted by a plurality of lenses and the projection optical system are incorporated into the exposure apparatus and optical adjustment is performed, and also reticle stage RST, wafer stage WST and the like that are made up of multiple mechanical parts are also attached to the body of the exposure apparatus and the wiring and piping are connected. And then, total adjustment (such as electrical adjustment and operation check) is performed, which completes the making of the exposure apparatus of the embodiment above. Incidentally, the exposure apparatus is preferably built in a clean room where conditions such as the temperature and the degree of cleanliness are controlled.

The semiconductor device is manufactured by passing though a step in which function and performance design of the device is performed, a step in which a reticle is manufactured based on the design step, a step in which a wafer is manufactured using silicon material, a step in which a pattern of the reticle is transferred onto a wafer by the exposure apparatus of the embodiment described above, a device assembly step (including the dicing process, the bonding process, and the packaging process), an inspection step and the like.

INDUSTRIAL APPLICABILITY

As has been described above, the best focus detection method of the present invention is suitable for detecting a best focus position of a projection optical system that forms an image of a pattern placed on a first surface on a second surface. Further, the exposure method and exposure apparatus of the present invention are suitable for transferring a pattern formed on a mask onto an object via a projection optical system.

What is claimed is:

1. A best focus detection method in which a best focus position of a projection optical system that forms an image of a pattern placed on a first surface onto a second surface is detected, the method comprising:

a first process in which while illuminating a mark placed on the first surface with an illumination light, a pattern plate on which an aperture pattern is formed is scanned in a predetermined measurement direction with respect to an image of the mark formed by the projection optical system within a two-dimensional plane that is orthogonal to an optical axis of the projection optical system and is in a vicinity of the second surface, the illumination light via the aperture pattern is received during the scanning, and position information of the image of the mark related to the measurement direction is detected;

a second process in which a position of the pattern plate is set within the two-dimensional plane based on the position information, the pattern plate is moved in the optical axis direction while illuminating the mark placed on the first surface with the illumination light, and position data of the pattern plate related to the optical axis direction and intensity data of the illumination light are obtained during the movement; and a third process in which a best focus position of the projection optical system is computed based on the obtained position data and the obtained intensity data, wherein in the second process, the position data related to the optical axis direction and the intensity data of the illumination light are obtained at predetermined sampling intervals, and in the third process, the best focus position of the projection optical system is computed based on a plurality of position data obtained at the predetermined sampling intervals and a plurality of intensity data obtained at the predetermined sampling intervals.

2. The best focus detection method according to claim 1 wherein
in the third process, one of the plurality of position data and the plurality of intensity data is smoothed at least once using moving average, a change curve of intensity of the illumination light with respect to a position in the optical axis direction of the pattern plate is computed using one of the data after smoothing and the other of the plurality of position data and the plurality of intensity data that is not smoothed, and the best focus position is computed based on the change curve.

3. The best focus detection method according to claim 2, wherein
in the third process, one of the plurality of position data and the plurality of intensity data is smoothed by moving average using a first sampling number that is set in advance based on the sampling interval and on a first frequency that is a representative frequency of disturbance included in the plurality of position data and the plurality of intensity data.

4. The best focus detection method according to claim 3, wherein
in the third process, after smoothing by moving average using the first sampling number, at least one of the plurality of position data and the plurality of intensity data is further smoothed by moving average using a second sampling number that is set in advance based on the sampling interval and on a second frequency that is a frequency of disturbance included in the plurality of position data and the plurality of intensity data and is different from the first frequency.

5. The best focus detection method according to claim 1, wherein
in the third process, the plurality of position data and the plurality of intensity data are smoothed at least once using moving average, a change curve of intensity of the illumination light with respect to a position in the optical axis direction of the pattern plate is computed using both data after smoothing, and the best focus position is computed based on the change curve.

6. The best focus detection method according to claim 5, wherein
in the third process, the plurality of position data and the plurality of intensity data are smoothed by moving average using a first sampling number that is set in advance based on the sampling interval and on a first frequency that is a representative frequency of disturbance included in the plurality of position data and the plurality of intensity data.

7. The best focus detection method according to claim 6, wherein
in the third process, after smoothing by moving average using the first sampling number, at least one of the plurality of position data and the plurality of intensity data is further smoothed by moving average using a second sampling number that is set in advance based on the sampling interval and on a second frequency that is a frequency of disturbance included in the plurality of position data and the plurality of intensity data and is different from the first frequency.

8. The best focus detection method according to claim 1, wherein
the illumination light is a pulse illumination light having a predetermined repetition frequency, and
obtaining of the position data of the pattern plate related to the optical axis direction and the intensity data of the illumination light in the second process is performed simultaneously with each emission of the pulse illumination light.

9. The best focus detection method according to claim 1 wherein
in the third process, a position in the optical axis direction of the pattern plate that corresponds to a midpoint between two intersections of a change curve of intensity of the illumination light with respect to a position in the optical axis direction of the pattern plate with a slice level that is set in a mid-level area other than areas in the vicinity of the maximum level and the minimum level of intensity of the change curve is computed as the best focus position.

10. The best focus detection method according to claim 9, wherein
in the third process, an average value of positions in the optical axis direction of the pattern plate that respectively correspond to a midpoint between two intersections of the change curve of intensity of the illumination light with respect to a position in the optical axis direction of the pattern plate with each of a plurality of slice levels that are set in the mid-level area of the change curve is computed as the best focus position.

11. The best focus detection method according to claim 1, wherein
the mark is one of an isolated pattern and a line-and-space pattern.

12. The best focus detection method according to claim 1, further comprising:
a fourth process in which, prior to the first process, while illuminating a mark placed on the first surface with the illumination light, the pattern plate is scanned in a predetermined measurement direction with respect to an image of the mark formed by the projection optical system within a two-dimensional plane that is orthogonal to an optical axis of the projection optical system and is in the vicinity of the second surface, a photoelectric conversion signal of a photodetection element that receives the illumination light via the aperture pattern is obtained during the scanning, and gain adjustment of the photodetection element is performed based on the obtained photoelectric conversion signal.

13. The best focus detection method according to claim 12, further comprising:
a fifth process in which after processing of the fourth process, prior to the first process, the judgment is made of whether or not the gain adjustment of the photodetection element performed in the fourth process is appropriate, and in the case the judgment is denied, the pattern plate is scanned in the measurement direction and the photoelectric conversion signal is obtained during the scanning while changing a position in the optical axis direction of the pattern plate in a predetermined procedure until the gain adjustment of the photodetection element is judged to be appropriate.

14. The best focus detection method according to claim 1, further comprising:
a sixth process in which after processing of the first process, prior to the second process, a judgment is made of whether or not an intensity signal of an image of the mark that is obtained from scanning positions in the measurement direction of the pattern plate and the illumination light received at each scanning position in the first process satisfies a predetermined threshold condition, and in a case that the judgment is made that the threshold condition is not satisfied, the pattern plate is scanned in the measurement direction and the intensity signal is obtained during the scanning while changing a position in the optical axis direction of the pattern plate in a predetermined procedure until the threshold condition is satisfied.

15. The best focus detection method according to claim 14, wherein
the threshold condition is that one of the maximum value and contrast of intensity of an image of the mark exceeds a predetermined threshold.

16. The best focus detection method according to claim 14, wherein
the threshold condition is that a line width of an image of the mark becomes smaller than a predetermined threshold.

17. An exposure method in which a predetermined pattern is formed on an object via a projection optical system, the method comprising:
a detection process in which a best focus position of the projection optical system is detected using the best focus detection method according to claim 1; and
an exposure process in which a position of the object in an optical axis direction of the projection optical system is adjusted based on a detection result of the best focus position, and the pattern is formed on the object via the projection optical system.

18. The exposure method according to claim 17, further comprising:
a process in which a detection unit that detects a position of the object in the optical axis direction of the projection optical system is adjusted based on a detection result of the best focus position, wherein
in the exposure process, a position of the object is adjusted using the detection unit that has been adjusted.

19. An exposure apparatus that forms a pattern placed on a first surface onto an object placed on a second surface using a projection optical system, the apparatus comprising:
a moving member on which an aperture pattern is arranged;
a drive system that drives the moving member in an optical axis direction of the projection optical system and directions within a two-dimensional plane that is orthogonal to the optical axis direction;
a sensor section that includes a photodetection element that receives an illumination light via the aperture pattern arranged on the moving member;
an illumination system that illuminates a mark placed on the first surface;
a first processing unit that scans and drives the moving member in a predetermined measurement direction via the drive system with respect to an image of the mark formed by the projection optical system within the two-dimensional plane that is in the vicinity of the second surface so that the aperture pattern is scanned in the measurement direction, while illuminating the mark with the illumination light from the illumination system, and detects position information of the image of the mark related to the measurement direction based on an output signal from the photodetection element of the sensor section during the scanning and driving;
a second processing unit that sets a position of the moving member within the two-dimensional plane based on the position information, moves the moving member in the optical axis direction via the drive system while illuminating the mark placed on the first surface with the illumination light from the illumination system, and obtains position data of the moving member related to the optical axis direction and intensity data of the illumination light during the movement; and
a computation unit that computes a best focus position of the projection optical system based on the position data obtained by the second processing unit and the intensity data obtained by the second processing unit, wherein
the second processing unit obtains the position data related to the optical axis direction and the intensity data of the illumination light at predetermined sampling intervals, and
the computation unit computes the best focus position of the projection optical system based on a plurality of position data obtained at the predetermined sampling intervals and a plurality of intensity data obtained at the predetermined sampling intervals.

20. The exposure apparatus according to claim 19, wherein
the computation unit performs moving average of data at least once to at least one of the plurality of position data and the plurality of intensity data, computes a change curve of intensity of a photoelectric conversion signal with respect to a position in the optical axis direction of the moving member using both data after smoothing, or one of the data after smoothing and the other of the data that is not smoothed, and computes the best focus position based on the change curve.

21. The exposure apparatus according to claim 19, further comprising:
a detection unit that detects a position in the optical axis direction of the object; and
an adjustment unit that adjusts the detection unit based on the best focus position computed by the computation unit.

22. A best focus detection method in which a best focus position of an optical system is detected, the method comprising:
forming an image of a mark by the optical system;
detecting position information of the image of the mark within a two-dimensional plane orthogonal to an optical axis of the optical system;
setting a position of a sensor within the two-dimensional plane based on the position information;
moving the sensor in the optical axis direction with respect to the image of the mark;
computing a best focus position of the optical system based on an output of the sensor while the sensor is moved in the optical axis direction, wherein
the output of the sensor comprises position data and intensity data that are obtained at predetermined sampling intervals; and
the best focus position of the optical system is computed based on a plurality of position data obtained at the predetermined sampling intervals and a plurality of intensity data obtained at the predetermined sampling intervals.

23. The best focus detection method according to claim 22, wherein
in the forming, the image of the mark is formed while illuminating the mark with an illumination light, and
in the detecting, the sensor is scanned in a predetermined measurement direction with respect to the image of the mark within the two-dimensional plane, the image of the mark detected by the sensor is received during the scanning, and position information of the image of the mark related to the measurement direction is detected.

24. The best focus detection method according to claim 23, wherein
in the moving, the sensor is moved in the optical axis direction while illuminating the mark with the illumination light, and the position data of the sensor related to the optical axis direction and the intensity data of the image of the mark are obtained during the movement.

25. The best focus detection method according to claim 24, wherein
in the computing, the best focus position of the optical system is computed based on the obtained position data and the obtained intensity data.

26. A best focus detection apparatus, the apparatus comprising:
a moving member;
a drive system that drives the moving member in an optical axis direction of an optical system and directions within a two-dimensional plane that is orthogonal to the optical axis direction;
a sensor mounted on the moving member;
a first processing unit that moves the moving member via the drive system with respect to an image of the mark formed by the optical system within the two-dimensional plane, and detects position information of the image of the mark based on an output signal from the sensor during the movement of the moving member;
a second processing unit that sets a position of the sensor within the two-dimensional plane based on the position information and moves the sensor in the optical axis direction with respect to the image of the mark; and
a computation unit that computes a best focus position of the optical system based on a result of the sensor while the sensor is moved in the optical axis direction, wherein
the output signal of the sensor comprises position data and intensity data that is obtained at predetermined sampling intervals, and
the computation unit computes the best focus position of the optical system based on a plurality of position data obtained at the predetermined sampling intervals and a plurality of intensity data obtained at the predetermined sampling intervals.

27. An exposure apparatus that forms a pattern on an object using an optical system, the apparatus comprising:
a detection unit that detects a position in the optical axis direction of the object; and
an adjustment unit that adjusts the detection unit based on the best focus position computed by the best focus detection apparatus according to claim 26.

* * * * *

UNITED STATES PATENT AND TRADEMARK OFFICE
CERTIFICATE OF CORRECTION

PATENT NO. : 7,566,893 B2
APPLICATION NO. : 11/630353
DATED : July 28, 2009
INVENTOR(S) : Naoto Kondo et al.

Page 1 of 1

It is certified that error appears in the above-identified patent and that said Letters Patent is hereby corrected as shown below:

On the Title Page

Item (75), should read "Naota Konda" to "Naoto Kondo."

Signed and Sealed this

Fifteenth Day of September, 2009

David J. Kappos
*Director of the United States Patent and Trademark Office*